United States Patent
Krah et al.

(10) Patent No.: US 10,541,280 B1
(45) Date of Patent: Jan. 21, 2020

(54) OLED BASED TOUCH SENSING AND USER IDENTIFICATION

(71) Applicant: Apple Inc., Cupertino, CA (US)

(72) Inventors: Christoph H. Krah, Cupertino, CA (US); Kingsuk Brahma, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 75 days.

(21) Appl. No.: 15/706,411

(22) Filed: Sep. 15, 2017

Related U.S. Application Data

(60) Provisional application No. 62/396,046, filed on Sep. 16, 2016.

(51) Int. Cl.
| | |
|---|---|
| *G06F 1/16* | (2006.01) |
| *H01L 27/32* | (2006.01) |
| *G06F 3/044* | (2006.01) |
| *G06F 3/041* | (2006.01) |
| *H01L 51/52* | (2006.01) |
| *G06F 3/042* | (2006.01) |

(52) U.S. Cl.
CPC .......... *H01L 27/323* (2013.01); *G06F 1/1643* (2013.01); *G06F 3/042* (2013.01); *G06F 3/044* (2013.01); *G06F 3/0412* (2013.01); *G06F 3/0416* (2013.01); *H01L 51/5206* (2013.01); *H01L 51/5221* (2013.01)

(58) Field of Classification Search
CPC ............... H01L 27/323; H01L 51/5206; H01L 51/5221; G06F 1/1643; G06F 3/0412; G06F 3/0416; G06F 3/042; G06F 3/044
See application file for complete search history.

(56) References Cited

U.S. PATENT DOCUMENTS

| | | | | |
|---|---|---|---|---|
| 5,416,573 A | * | 5/1995 | Sartor, Jr. .......... | G06K 9/00046 356/71 |
| 5,483,261 A | | 1/1996 | Yasutake | |
| 5,488,204 A | | 1/1996 | Mead et al. | |
| | | (Continued) | | |

FOREIGN PATENT DOCUMENTS

| | | |
|---|---|---|
| JP | 2000-163031 A | 6/2000 |
| JP | 2002-342033 A | 11/2002 |

OTHER PUBLICATIONS

Final Office Action dated Jan. 20, 2016, for U.S. Appl. No. 14/280,355, filed May 16, 2014, 20 pages.

(Continued)

*Primary Examiner* — Christopher E Leiby
(74) *Attorney, Agent, or Firm* — Kubota & Basol LLP

(57) ABSTRACT

A touch screen configured for optical touch sensing and user identification using organic light emitting diodes (OLEDs) is disclosed. In some examples, one or more OLEDs can be used to display one or more images on the device, can be configured to emit light for optical touch sensing, and/or can be configured to detect a reflection of the emitted light. The touch screen can include a spatial filter configured to focus light emitted from the OLEDs and/or reflected light detected by the OLEDs for improved optical touch sensing. Using optical touch sensors, the touch screen can be capable of discerning between water and an object (e.g., finger) and/or noise (e.g., ambient light) and an object. The touch screen can also be capable of identifying (e.g., authenticating) a user using the active area of the device.

22 Claims, 21 Drawing Sheets

(56) References Cited

U.S. PATENT DOCUMENTS

| | | | |
|---|---|---|---|
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,348,946 B2 * | 3/2008 | Booth, Jr. | G09G 3/3208 345/82 |
| 7,663,607 B2 | 2/2010 | Hotelling et al. | |
| 8,479,122 B2 | 7/2013 | Hotelling et al. | |
| 8,624,849 B2 | 1/2014 | Chang et al. | |
| 8,754,862 B2 * | 6/2014 | Zaliva | G06F 3/03547 345/173 |
| 9,052,772 B2 * | 6/2015 | West | G06F 3/0416 |
| 9,836,165 B2 | 12/2017 | Nho et al. | |
| 2004/0252867 A1 * | 12/2004 | Lan | G06K 9/0004 382/124 |
| 2006/0169608 A1 | 8/2006 | Carnevali | |
| 2006/0197753 A1 | 9/2006 | Hotelling | |
| 2007/0216637 A1 | 9/2007 | Ito | |
| 2008/0112677 A1 | 5/2008 | Smith | |
| 2008/0121442 A1 | 5/2008 | Boer et al. | |
| 2010/0265206 A1 | 10/2010 | Chen | |
| 2010/0283756 A1 | 11/2010 | Ku et al. | |
| 2011/0187668 A1 | 8/2011 | Hente | |
| 2012/0113050 A1 | 5/2012 | Wang et al. | |
| 2013/0057495 A1 | 3/2013 | Wang et al. | |
| 2013/0088425 A1 | 4/2013 | Yun et al. | |
| 2013/0147727 A1 | 6/2013 | Lee et al. | |
| 2013/0147730 A1 | 6/2013 | Chien et al. | |
| 2013/0221856 A1 * | 8/2013 | Soto | G06F 3/0412 315/152 |
| 2013/0265276 A1 | 10/2013 | Obeidat et al. | |
| 2013/0306946 A1 | 11/2013 | Chang et al. | |
| 2014/0110683 A1 | 4/2014 | Huang et al. | |
| 2014/0118419 A1 | 5/2014 | Wu et al. | |
| 2014/0145976 A1 | 5/2014 | Tang et al. | |
| 2014/0346493 A1 | 11/2014 | Lee | |
| 2014/0362306 A1 | 12/2014 | Chen et al. | |
| 2015/0015517 A1 | 1/2015 | Zhao | |
| 2015/0070301 A1 | 3/2015 | Chia et al. | |
| 2015/0091849 A1 | 4/2015 | Ludden | |
| 2015/0331508 A1 | 11/2015 | Nho et al. | |
| 2018/0046281 A1 * | 2/2018 | Pi | A61B 5/02416 |

OTHER PUBLICATIONS

Final Office Action dated Mar. 17, 2017, for U.S. Appl. No. 14/280,355, filed May 16, 2014, 22 pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action dated Jul. 17, 2015, for U.S. Appl. No. 14/280,355, filed May 16, 2014, twelve pages.

Non-Final Office Action dated Aug. 26, 2016, for U.S. Appl. No. 14/280,355, filed May 16, 2014, 20 pages.

Notice of Allowance dated Aug. 1, 2017, for U.S. Appl. No. 14/280,355, filed May 16, 2014, nine pages.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

| FUNCTION | PIXEL ENABLE PEN 401 | GATE ENABLE GEN 403 | DATA ENABLE DEN 405 | DATA SELECT DSEL 407 |
|---|---|---|---|---|
| OLED UPDATE SAMPLE DATA LINE VOLTAGE ON CST | HIGH | LOW | LOW | LOW |
| OLED DRIVING ILLUMINATE OLED BASED ON CONSTANT CURRENT SET BY VOLTAGE ACROSS CST | LOW | X | HIGH | X |
| OLED SENSING REVERSE BIAS OLED AT (V)-VBIAS) AND MEASURE CHARGE THROUGH OLED VIA SENSE AMPLIFIER | HIGH | HIGH | LOW | HIGH |

SIGNAL

OLED BASED TOUCH SENSING AND USER IDENTIFICATION

CROSS-REFERENCE TO RELATED APPLICATIONS

This application claims the benefit of U.S. Provisional Patent Application No. 62/396,046, filed Sep. 16, 2016, which is hereby incorporated by reference in its entirety for all purposes.

FIELD OF THE DISCLOSURE

This relates to a touch screen and, more particularly, to a touch screen configured for optical touch sensing and user identification using organic light emitting diodes (OLEDs).

BACKGROUND OF THE DISCLOSURE

Many types of input devices are presently available for performing operations in a computing system, such as buttons or keys, mice, trackballs, joysticks, touch sensor panels, touch screens, and the like. Touch screens, in particular, are becoming increasingly popular because of their ease and versatility of operation as well as their declining price. Touch screens can include a touch sensor and a display device positioned partially or fully behind the touch sensor so that the touch-sensitive surface can cover at least a portion of the active area of the display device. The display device can include technologies such as liquid crystal displays (LCDs), organic light emitting diode (OLED) displays, etc. OLEDs, for example, can provide a flat or flexible display in a relatively thin package that can be suitable for use in a variety of portable electronic devices. In addition, OLED displays can display brighter and more vibrant images in a thinner and lighter package compared to LCD displays, making them suitable for use in compact portable electronic devices.

Sensing a proximate object using one or more capacitance-based (e.g., self- and/or mutual capacitance) touch sensors can provide an input modality for an electronic device. Recent advancements in touch sensor technology have allowed capacitance-based touch sensors to perform at higher speeds and at higher touch resolutions than was previously possible. Some applications, such as user identification, may desire a higher sensitivity and/or resolution than capacitance-based touch sensing.

SUMMARY OF THE DISCLOSURE

This relates to a touch-sensitive display and, more particularly, to a touch screen configured for optical touch sensing and user identification using organic light emitting diodes (OLEDs). In some examples, one or more OLEDs can be used to display one or more images on the device, can be configured to emit light for optical touch sensing, and/or can be configured to detect a reflection of the emitted light. In some examples, an approximate touch location can be determined by optical touch sensors. In some examples, an approximate touch location can be determined by capacitive touch sensors, and one or more finer details can be resolved by optical touch sensors. The touch screen can include a spatial filter configured to focus light emitted from the OLEDs and/or reflected light detected by the OLEDs for improved optical touch sensing. Emitted light can reflect off an object (e.g., a finger) touching or hovering proximate to the touch screen, for example. Using optical touch sensors, the touch screen can be capable of discerning between water and an object (e.g., finger) and/or noise (e.g., ambient light) and an object. The touch screen can also be capable of identifying (e.g., authenticating) a user using the active area of the device.

BRIEF DESCRIPTION OF THE DRAWINGS

FIG. 4B illustrate an exemplary table of operations for optical touch sensing according to examples of the disclosure.

DETAILED DESCRIPTION

In the following description of examples, reference is made to the accompanying drawings in which it is shown by way of illustration specific examples that can be practiced. It is to be understood that other examples can be used and structural changes can be made without departing from the scope of the various examples.

This relates to a touch-sensitive display and, more particularly, to a touch screen configured for optical touch sensing and user identification using organic light emitting diodes (OLEDs). In some examples, one or more OLEDs can be used to display one or more images on the device, can be configured to emit light for optical touch sensing, and/or can be configured to detect a reflection of the emitted light. In some examples, an approximate touch location can be determined by optical touch sensors. In some examples, an approximate touch location can be determined by capacitive touch sensors, and one or more finer details can be resolved by optical touch sensors. The touch screen can include a spatial filter configured to focus light emitted from the OLEDs and/or reflected light detected by the OLEDs for improved optical touch sensing. Emitted light can reflect off an object (e.g., a finger) touching or hovering proximate to the touch screen, for example. Using optical touch sensors, the touch screen can be capable of discerning between water and an object (e.g., finger) and/or noise (e.g., ambient light) and an object. The touch screen can also be capable of identifying (e.g., authenticating) a user using the active area of the device.

Figure 1:
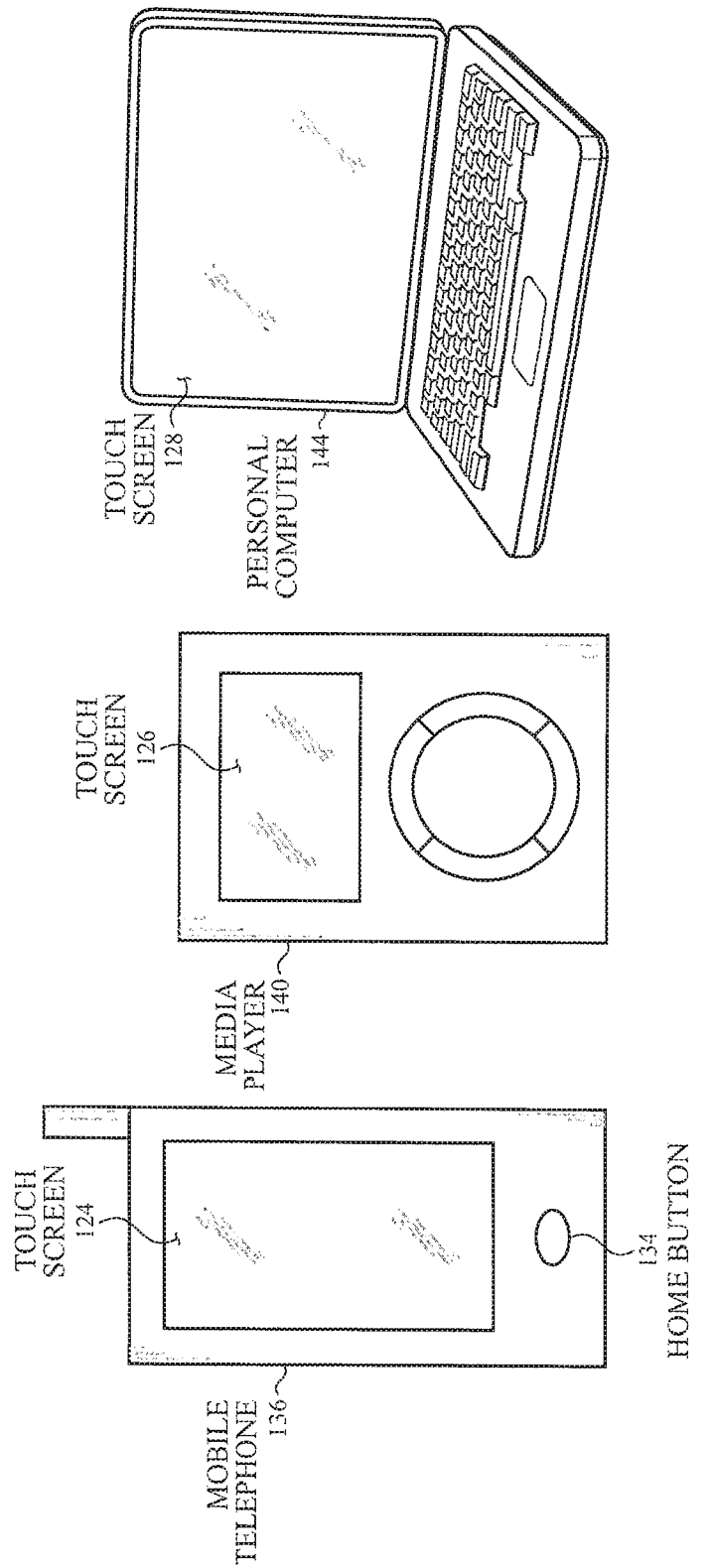
FIG. 1A illustrates an example mobile telephone that includes a touch screen according to examples of the disclosure.
FIG. 1B illustrates an example digital media player that includes a touch screen according to examples of the disclosure.
FIG. 1C illustrates an example personal computer that includes a touch screen according to examples of the disclosure.

FIGS. 1A-1C illustrate exemplary systems including a touch screen according to examples of the disclosure. Mobile telephone 136 can include touch screen 124 and home button 134. In some examples, touch screen 124 can be visible in the viewable area of mobile telephone 136. Media player 140 can include touch screen 126. Personal computer 144 (e.g., a tablet computer or desktop computer) can include touch screen 128. Touch screen 124, touch screen 126, and/or touch screen 128 can include one or more components and/or functionality as described below.

Figure 2:
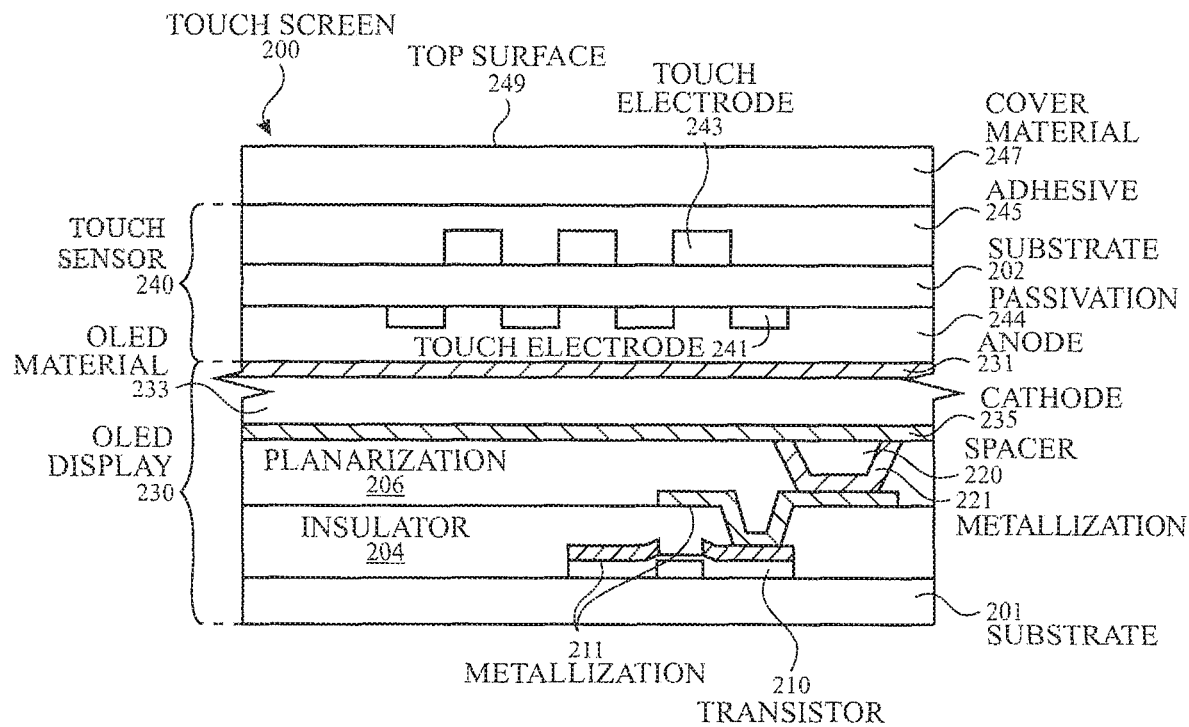
FIG. 2 illustrates a cross-sectional view of an exemplary touch screen according to examples of the disclosure.

FIG. 2 illustrates a cross-sectional view of an exemplary touch screen according to examples of the disclosure. Touch screen 200 can include OLED display 230 and touch sensor 240. OLED display 230 can be configured for displaying one or more images. OLED display 230 can include transistor 210, metallization 211 and 221, insulator 204, planarization 206, spacer 220, cathode 235, OLED material 233, and anode 231 deposited on substrate 201. Substrate 201 can be configured for supporting OLED display 230. For example, substrate 201 can act as a protective layer between transistor 210 and additional components of a host device incorporating touch screen 200.

Transistor 210 can include any type of switch configured for activating (or deactivating) one or more pixels included in OLED display 230. Transistor 210 can include a gate, a source connected to a source, and a drain connected to cathode 235. Metallization 211 and 221 can be any type of conductor configured for routing a voltage signal, for example, between transistor 210 and cathode 235. Insulator 204 and planarization 206 can be configured for insulating transistor 210 and any additional transistors (not shown) included in OLED display 230, for example. Spacer 220 can be configured to maintain a sufficient distance between cathode 235 and transistor 210 to minimize any damage to OLED display 230 that can be created from external forces (e.g., from a finger or stylus) applied to touch screen 200.

To display an image, transistor 210 can be switched on by applying an appropriate voltage to the gate of the transistor 210. A voltage can be applied to cathode 235 through the source of transistor 210 and metallization 211 and 221. Another voltage can be applied to anode 231. In some examples, the voltage applied to anode 231 can be greater (e.g., more positive) than the voltage applied to cathode 235 (e.g., the OLED can be forward biased). If the voltage difference between cathode 235 and anode 231 is greater than a threshold voltage, OLED material 233 can generate light emitted towards top surface 249 with an intensity based on the applied voltage difference.

Although FIG. 2 illustrates the OLED display as including an anode, OLED material, and a cathode, examples of the disclosure can include additional components. For example, one or more color filters can be included between the OLED material and the cover material (e.g., for displaying a plurality of colors using white OLEDs). Further, although FIG. 2 illustrates cathode 235 as electrically coupled to transistor 210 with anode 231 disposed on a top side of OLED material 233, examples of the disclosure can include the polarity of the OLED stack-up as reversed. That is, an anode can be electrically coupled to one or more transistors with a cathode located on the top side (i.e., side closer to top surface 249) of the OLED material.

In some instances, the display may further comprise touch sensor 240, which can be configured for detecting an object touching and/or proximate to top surface 249 of touch screen 200. Touch sensor 240 can include a plurality of touch electrodes (e.g., touch electrode 241 and touch electrode 243) deposited on substrate 202. Touch electrode 241 and touch electrode 243 can be made out of ITO or another suitable conductive material, for example. In some examples, touch electrode 241 and touch electrode 243 can be configured to sense a change in a capacitance relative to one or more of the touch electrodes (e.g., mutual capacitance between touch electrode 241 and touch electrode 243) or a change in capacitance (e.g., self-capacitance) relative to ground, where the change in capacitance can be indicative of an object proximate to or contacting top surface 249. For example, touch electrode 241 and touch electrode 243 can act as two plates of a parallel plate capacitor, and substrate 202 can act as a dielectric, electrically isolating touch electrode 241 and touch electrode 243.

In some examples, touch electrode 241 can receive a signal (e.g., a drive signal or a stimulation signal) from drive circuitry (not shown). Capacitive coupling between touch electrode 241 and touch electrode 243 can cause touch electrode 243 to carry a signal as a result of the driven signal on touch electrode 241, for example. When a conductive object (e.g., a finger or a stylus) is touching or proximate to top surface 249, the object can receive charge due to capacitive coupling. Touch electrode 243 can be electrically coupled to sense circuitry (not shown), which can be configured to measure the capacitively coupled signal at touch electrode 243 (or routing signals electrically coupled to touch electrode 243). Based on the measured signal, a touch controller (not shown) can determine how much charge, if any, has been coupled to the object, thereby detecting touch and/or hover events.

Although FIG. 2 illustrates touch screen 200 as including two layers of touch electrodes (e.g., touch electrode 241 and touch electrode 243) for detecting a mutual capacitance indicative of a proximate object, in some examples, other types of touch sensors are possible. Accordingly, many different configurations and touch sensing technologies can be employed without departing from or with respect to claimed subject matter scope. For example, a touch sensor configuration can utilize, but is not limited to, touch sensing technologies that employ resistive, surface acoustic, self-capacitance, mutual capacitance, or any combinations thereof.

Touch screen 200 can further include one or more of passivation 244, adhesive 245, and cover material 247. Passivation 244 can be configured for insulating touch sensor 240 from OLED display 230. Adhesive 245 can attach one or more layers of touch screen 200 to cover material 247. In some examples, adhesive 245 can be an optically clear adhesive (OCA) and/or a pressure sensitive adhesive (PSA). Cover material 247 can be configured for protecting one or more layers included in touch screen 200, for example. In some examples, cover material 247 can protect the underlying layers of touch screen 200 while allowing a user to view one or more displayed images emitted by OLED display 230 and/or perform an operation and/or action using touch sensor 240.

Due to the touch sensor 240 located between and separating OLED display 230 from top surface 249, in some examples, display brightness and/or clarity can be reduced. For example, light emitted by OLED material 233 can pass through touch sensor 240, but may be partially absorbed by one or more components of the touch sensor. A touch screen including a fewer number of components and/or layers in between the OLED display and the top surface 249 of the touch screen can reduce device thickness and manufacturing costs and complexity, for example.

Figure 3A:
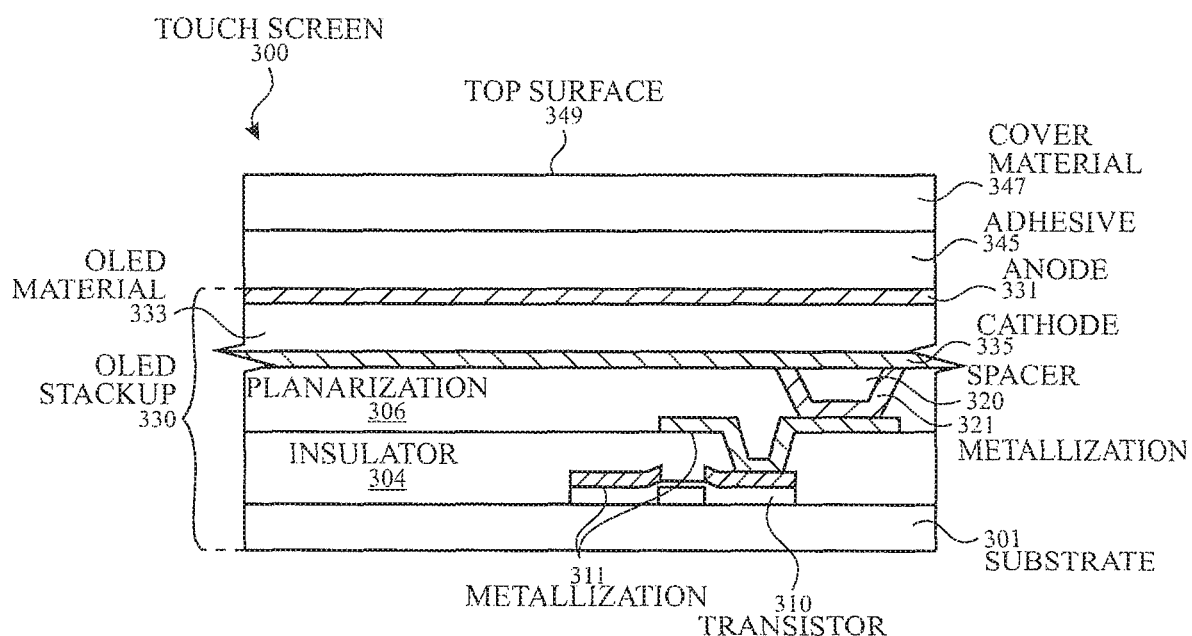
FIG. 3A illustrates a cross-sectional view of an exemplary touch screen configured for optical touch sensing using a plurality of OLEDs according to examples of the disclosure.

In some instances, the touch screen can be configured for optical touch sensing. FIG. 3A illustrates a cross-sectional view of an exemplary touch screen including a plurality of OLEDs configured for displaying an image and optical touch sensing according to examples of the disclosure. Touch screen 300 can include OLED stackup 330, cover material 347, and adhesive 345. OLED stackup 330 can include transistor 310, metallization 311 and 321, insulator 304, planarization 306, spacer 320, cathode 335, OLED material 333, and anode 331 deposited on substrate 301. Substrate 301 can be configured for supporting OLED stackup 330. For example, substrate 301 can act as a protective layer between transistor 310 and additional components of a host device incorporating touch screen 300.

Cover material 347 can be configured for protecting one or more layers included in touch screen 300, for example. In some examples, cover material 347 can protect the underlying layers of touch screen 300 while allowing a user to view one or more displayed images emitted by OLED stackup 330 and to perform an operation and/or action using touch inputs detected by OLED stackup 330. In some examples, the cover material 347 can be attached to the one or more layers of touch screen 300 using adhesive 345 (e.g., an optically clear adhesive (OCA)). Top surface 349 of touch screen 300 can be accessible to a user of the touch screen to display an image and/or to receive a touch input, for example.

Touch screen 300 can include plurality of pixels, where each pixel can include an OLED (e.g., a region of OLED stackup 330) and a transistor (e.g., transistor 310), for example. In some examples, the plurality of pixels can be individually addressable by way of individually addressable transistors (e.g., transistor 310). In some examples, transistor 310 can be a thin-film transistor (TFT). Transistor 310 can include any type of switch configured for activating (or deactivating) a display pixel. Transistor 310 can include a gate, a source connected to a source (e.g., source ICS1 or source ICS2 illustrated in FIG. 3C), and a drain connected to cathode 335. Metallization 311 and 321 can be any type of conductive material configured for routing a voltage signal, for example, between transistor 310 and cathode 335. Insulator 304 and planarization 306 can be configured for insulating transistor 310 and any additional transistors (not shown) included in touch screen 300, for example. Spacer 320 can be configured to maintain sufficient distance between cathode 335 and transistor 310 to minimize any damage to OLED stackup 330 that can be created from external forces applied to touch screen 300.

Although FIG. 3A illustrates an exemplary touch screen 300 including OLED stackup 330, additional components can be included in an OLED stackup. For example, an OLED stackup can include one or more color filters located between OLED material 333 and cover material 347 (e.g., for delineating light emitted by white OLED elements into a plurality of colors). Although FIG. 3A illustrates cathode 335 as electrically coupled to transistor 310 with anode 331 disposed on a top side of OLED material 333, in some examples, the polarity of the OLED stackup can be reversed. That is, an anode can be electrically coupled to one or more transistors with a cathode located on the top side (e.g., side closer to top surface 349) of the OLED material.

Figure 3B:
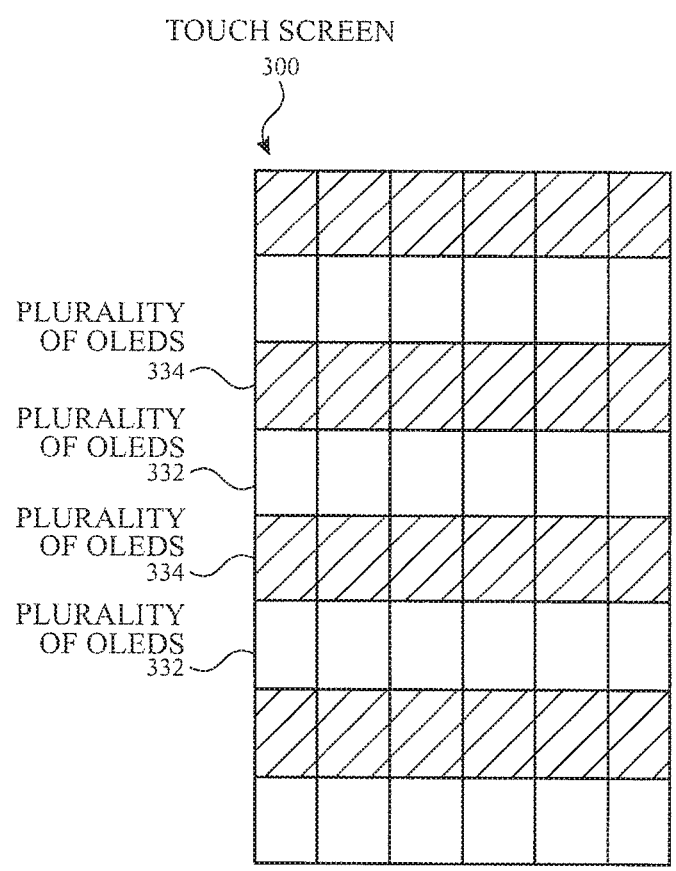
FIG. 3B illustrates a top view of an exemplary touch screen configured for optical touch sensing using a plurality of OLEDs according to examples of the disclosure.

In some examples, optical touch sensing can include a first plurality of OLEDs configured with a different mode than a second plurality of OLEDs for optical touch sensing. FIG. 3B illustrates a top view of an exemplary touch screen including a first plurality of OLEDs interleaved with a second plurality of OLEDs for displaying an image and optical touch sensing according to examples of the disclosure. Touch screen 300 can include a plurality of OLEDs (e.g., plurality of OLEDs 332 and plurality of OLEDs 334). Plurality of OLEDs 332 and plurality of OLEDs 334 can include OLED stackup 330 (illustrated in FIG. 3A). Each OLED can be configured to operate in one of a plurality of modes: emission mode, sensing mode, or off mode. For example, the plurality of rows of OLEDs configured in the same mode (e.g., emission mode while displaying one or more images on the touch screen). Alternatively, the first plurality of OLEDs (e.g., plurality of OLEDs 334) can be configured in a different mode (e.g., emission mode) than the plurality of second OLEDs (e.g., plurality of OLEDs 332). Although the figure illustrates plurality of OLEDs 332 interleaved with plurality of OLEDs 334, examples of the disclosure can include any type of arrangement. Moreover, the arrangement for the modes that the OLEDs are operating in can change dynamically. For example, during a first time period, a row of OLEDs can be configured in the emission mode, but during a second time period, the row of OLEDs can be configured in the sensing mode. In some examples, the mode of each OLED can be determined on a row-by-row basis (e.g., the first two rows can be configured in emission mode, while the next row can be configured in sensing mode). In some examples, touch screen 300 can exclude capacitive touch sensors. Although FIG. 3B illustrates OLEDs grouped into rows, examples of the disclosure can include other arrangements. For example, the touch screen can include OLEDs grouped into columns or clusters (e.g., forming a checkerboard pattern, as illustrated in FIG. 3L), etc.

Figure 3C:
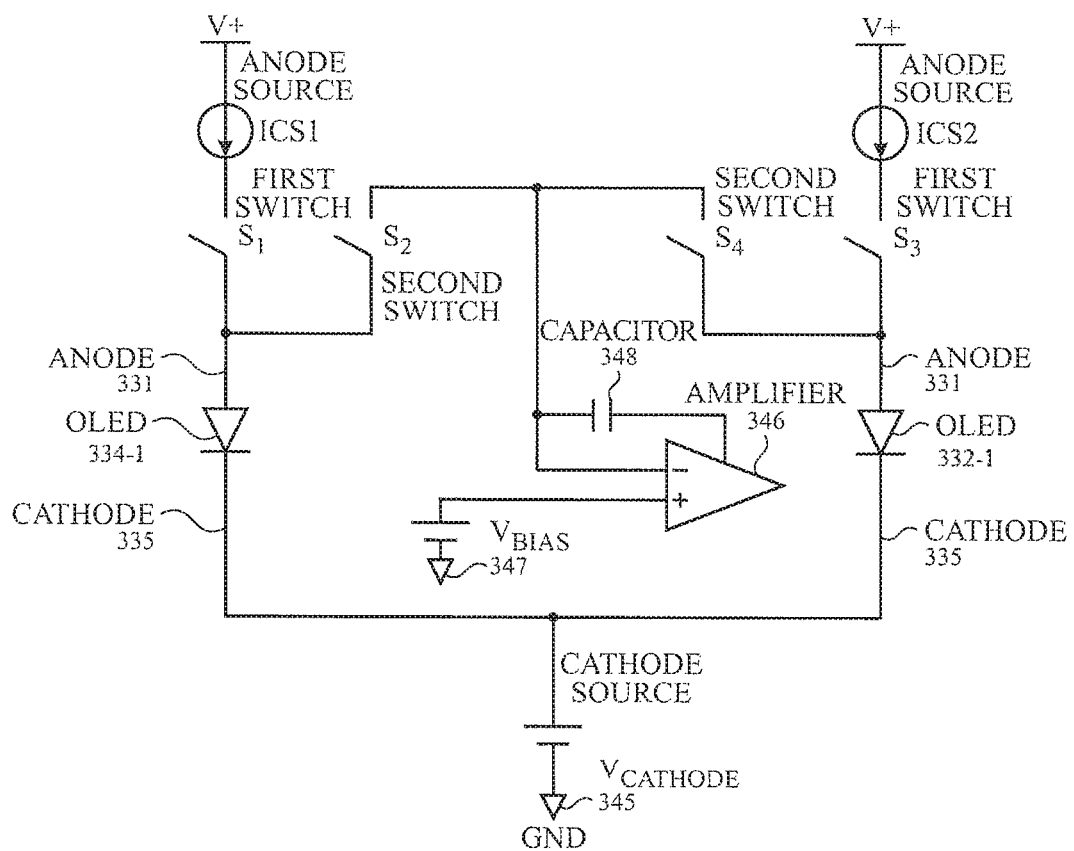
FIG. 3C illustrates exemplary circuitry coupled to the plurality of OLEDs according to examples of the disclosure.

FIG. 3C illustrates an exemplary circuit coupled to the plurality of OLEDs according to examples of the disclosure. The circuit can switchably couple one or more OLEDs (e.g., OLED 332-1 and/or OLED 334-1) to drive circuitry (e.g., source ICS1 and/or source ICS2) and sense circuitry (e.g., amplifier 346, capacitor 348, and Vbias 347).

First switch S1 and second switch S2 can be coupled to OLED 334-1; second switches S3 and first switch S4 can be coupled to OLED 332-1. Each OLED (e.g., OLED 332-1 and OLED 334-1) can include the anode (e.g., anode 331) coupled to a source (e.g., source ICS1 or source ICS2) via first switches (e.g., switch or S1 and switch S3). OLED 334-1 and OLED 332-1 can also be switchably coupled through second switches switch S2 and S4 to amplifier 346, respectively. The cathode (e.g., cathode 335) can be coupled to voltage source Vcathode 335. While the circuitry is illustrated as electrically coupling (i.e., shared between) OLED 332-1 and OLED 334-1, it should be appreciated that each OLED (or group or row of OLEDs) may have their own respective drive and sense circuitry.

To configure an OLED to operate under forward bias (e.g., during emission mode), the first switch (e.g., first switch S1 or first switch S3) can electrically couple the anode (e.g., anode 331) of the OLED to an anode source (e.g., source ICS1 or source ICS2), and the second switch (e.g., second switch S2 or second switch S4) can electrically decouple the anode of the OLED from sense circuitry (e.g., amplifier 346, capacitor 348, and Vbias 347). The source line connection may be or may not be shared.

The anode source (e.g., source ICS1 or ICS2) can be configured to provide a current (e.g., a display image-dependent current) to the respective OLED (e.g., OLED 332-1 or OLED 334-1), while the cathode (e.g., cathode 335) can be held at a voltage level approximately at GND. V+ can be held at a voltage level high enough to sustain the currents through each respective OLED. In some examples, V+ can be configured with a greater (e.g., more positive) voltage than Vcathode 335. If the voltage difference between cathode 335 and anode 331 is greater than the threshold voltage of the OLED, OLED material (e.g., OLED material 333 illustrated in FIG. 3A) can generate light (e.g., towards top surface 349 illustrated in FIG. 3A) with an intensity based on the current through the OLED.

To configure the OLED to operate under reverse bias (e.g., during sensing mode), the second switch (e.g., second switch S2 or second switch S4) can electrically couple the anode (e.g., anode 331) of the OLED to sense circuitry (e.g., (e.g., amplifier 346, capacitor 348, and Vbias 347), and the first switch (e.g., first switch S1 or first switch S3) can electrically decouple the anode to the anode source (e.g., source ICS1 or ICS2). Vbias 347 can be configured to provide a lower (e.g., less positive) voltage than cathode source Vcathode 335. In this manner, the OLED can be configured detect light and generate a photocurrent that can be sensed by the sense circuitry.

Figure 3D:
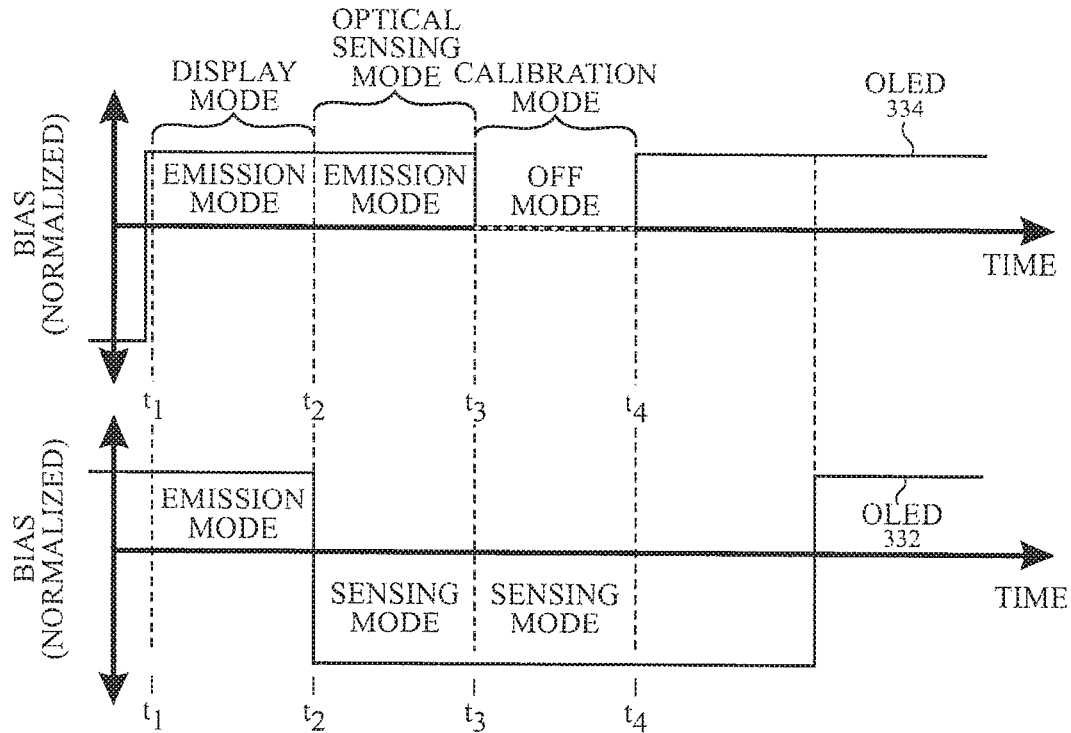
FIG. 3D illustrates an exemplary timing diagram for optical touch sensing according to examples of the disclosure.

Plurality of OLEDs 332 and plurality of OLEDs 334 and associated circuitry can be configured to operate in the same modes or in different modes, depending on whether touch screen is configured for display mode or optical touch sensing mode. FIG. 3D illustrates an exemplary timing diagram for alternating between displaying an image, optical touch sensing, and calibrating according to examples of the disclosure. Each OLED (e.g., OLED 332-1 or OLED 334-1) can be configured to operate in one or more operation modes: an emission mode, a sensing mode, and an off mode.

At a time $t_1$, the touch screen can be configured in a display mode by configuring both OLED 332-1 and OLED 334-1 to operate in the emission mode. At time $t_2$, the touch screen can be configured in an optical sensing mode by configuring OLED 334-1 to operate in the emission mode and OLED 332-1 to operate in the sensing mode. At time $t_3$, the touch screen can be configured in a calibration mode. OLED 334-1 can be configured in the off mode (e.g., electrically decoupled from both drive and sense circuitry). OLED 332-1 can be configured to operate in the sensing mode. The calibration procedure is described in more detail with reference to FIG. 8C (below).

Figure 3E:
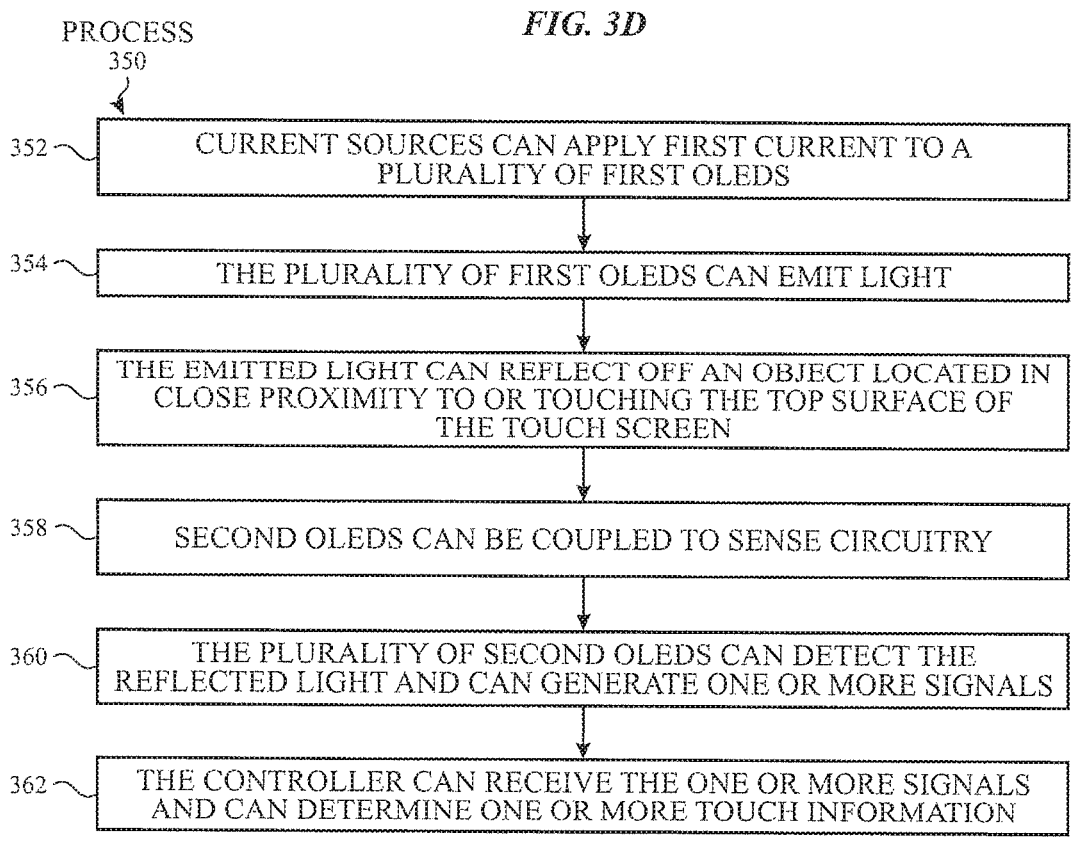
FIG. 3E illustrates an exemplary method for optical touch sensing according to examples of the disclosure.

FIG. 3E illustrates an exemplary method for configuring the plurality of OLEDs for optical touch sensing according to examples of the disclosure. A plurality of first OLEDs (e.g., plurality of OLEDs 334) can be configured to operate in the emission mode by configuring the anode sources (e.g., anode source ICS1 or anode source ICS2 illustrated in FIG. 3C) to apply first currents to the anode (e.g., anode 331) (step 352 of process 350). The plurality of first OLEDs can emit light (step 354 of process 350). The emitted light can reflect off an object (e.g., a finger or stylus) located in close proximity to or in contact with the top surface (e.g., surface 349 illustrated in FIG. 3A) (step 356 of process 350). A plurality of second OLEDs (e.g., plurality of OLEDs 332) can be configured to operate in the sensing mode by coupling (e.g., using switch S3) to sense circuitry (e.g., charge amplifier 346, capacitor 348, and Vbias 347) (step 358 of process 350). In some examples, the plurality of second OLEDs can be electrically decoupled from the anode source (e.g., anode source ICS2 illustrated in FIG. 3C) to prevent a forward-bias that could cause the plurality of second OLEDs to emit light. The plurality of second OLEDs can detect light that has reflected off the proximate object and can generate one or more signals (step 360 of process 350). The controller (not shown) can receive the one or more signals and can determine one or more touch (and/or hover) information (step 362 of process 350).

In some examples, OLED stackup 330 can be configured to operate in emission mode during one time period and can be configured to operate in sensing mode during another time period. In some examples, the currents through OLEDs 332 and OLEDs 334 can be the same for emission and sensing modes. In some examples, the currents through OLEDs 332 and OLEDs 334 can be different for emission and sensing modes.

Figure 3F:
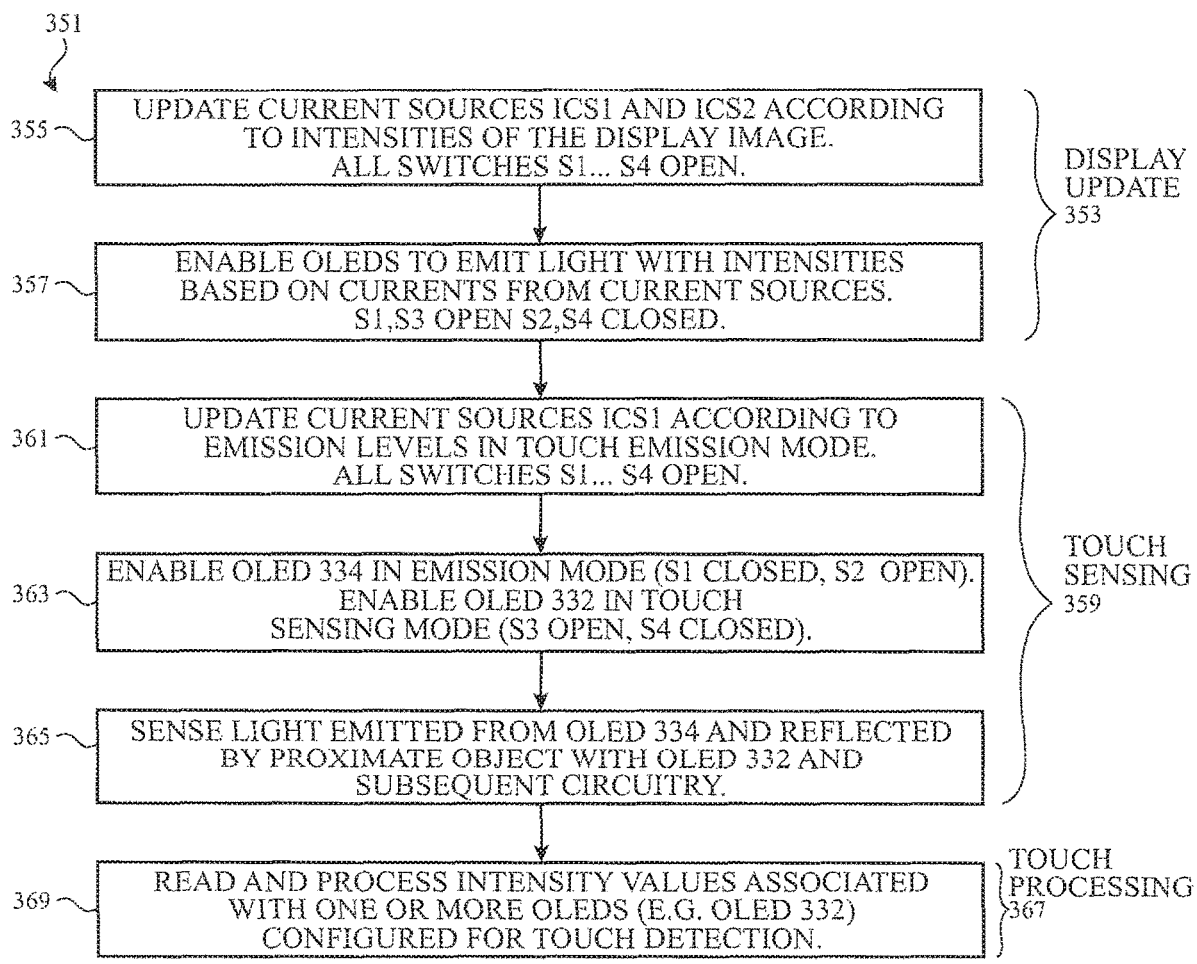
FIG. 3F illustrates an exemplary method for displaying an image and optically detecting touch according to examples of the disclosure.

FIG. 3F illustrates an exemplary method for displaying an image and optically detecting touch according to examples of the disclosure. Process 351 can include updating the display in step 353. In some examples, updating the display can include updating the anode source(s) (e.g., anode source ICS1 and/or anode source ICS2) according to the intensity levels of the displayed image at the respective locations of the OLEDs (e.g., OLEDs 334 and/or 332) (step 355 of process 351). During the display update, all switches S1, S2, S3, and S4 can be configured to electrically decouple (i.e., "open") circuitry. First switches S1 and S3 can be configured for electrically coupling (i.e., "closed") to enable the OLEDs 332 and OLEDs 334 to operate in the emission mode (step 357 of process 351). The touch screen can be configured to switch to touch sensing in step 359. Anode source(s) (e.g., anode source ICS1 and/or anode source ICS2) can be updated according to the light intensity levels required for optical touch sensing mode while all switches S1, S2, S3, and S4 be configured to electrically decouple circuitry (step 361 of process 351). OLED 334-1 can be configured to operate in the emission mode by configuring first switch S1 for electrically coupling and second switch S2 for electrically decoupling. OLED 332-1 can be configured to operate in the sensing mode by configuring second switch S4 for electrical coupling and first switch S3 for electrical decoupling (step 363 of process 351). OLED 332-1 can receive reflected light (e.g., light emitted by OLED 334-1 and reflected off a user's finger) and can generate a photocurrent to be sensed by sense circuitry (step 365 of process 351). The sensed photocurrent can be digitized by an ADC to obtain a digital representation of the intensity of the reflected light. In some examples, the sensed touch data can be processed in step 367. Step 367 can include reading and processing the intensity level of the received light associated with one or more OLEDs (e.g., OLED 332-1) (step 369 of process 351). In some examples, the intensity of received light can also be used for fingerprint recognition, as will be described below.

Figure 3G:
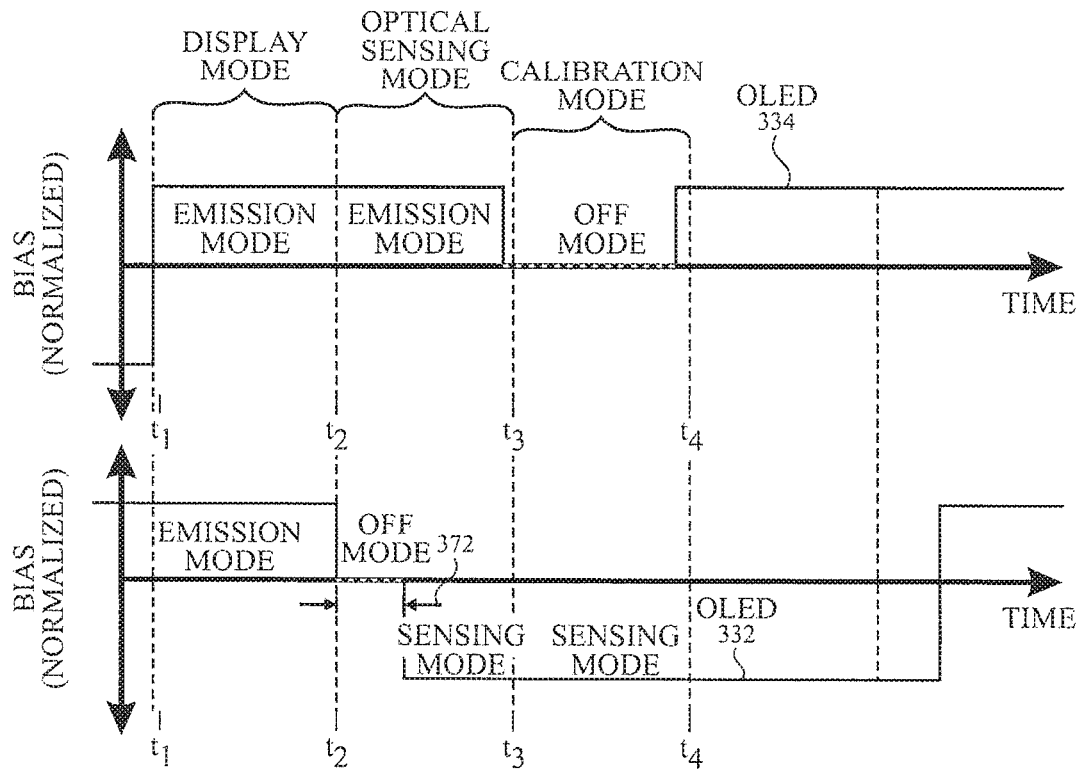
FIG. 3G illustrates an exemplary timing diagram for optical touch sensing according to examples of the disclosure.

In some examples, the optical touch sensing mode can operate with a non-zero delay between light emitted the plurality of first OLEDs and a reflection of the light sensed by the plurality of second OLEDs. FIG. 3G illustrates an exemplary timing diagram for optical touch sensing using a non-zero delay between the emission mode of the plurality of first OLEDs and the sensing mode of the plurality of second OLEDs according to examples of the disclosure. Non-zero delay 372 can be included, for example, to account for time for light to be emitted by the OLEDs, reflect off the object, and detected by the OLEDs. For example, the device can prompt the user to touch a portion of the touch screen, where the prompt can include emitting light by the OLEDs. The user can touch the portion of the touch screen, but only after reading the prompt, which may include a non-zero delay.

Figure 3H:
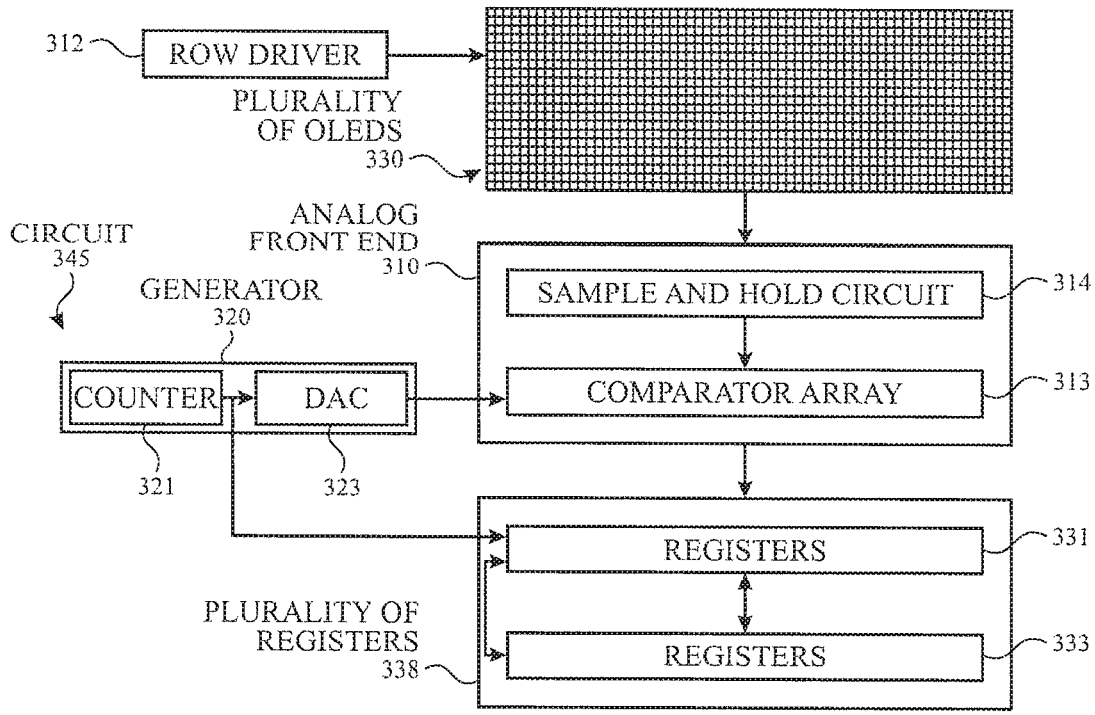
FIG. 3H illustrates an exemplary block diagram for processing optical touch information according to examples of the disclosure.
Figure 3I:
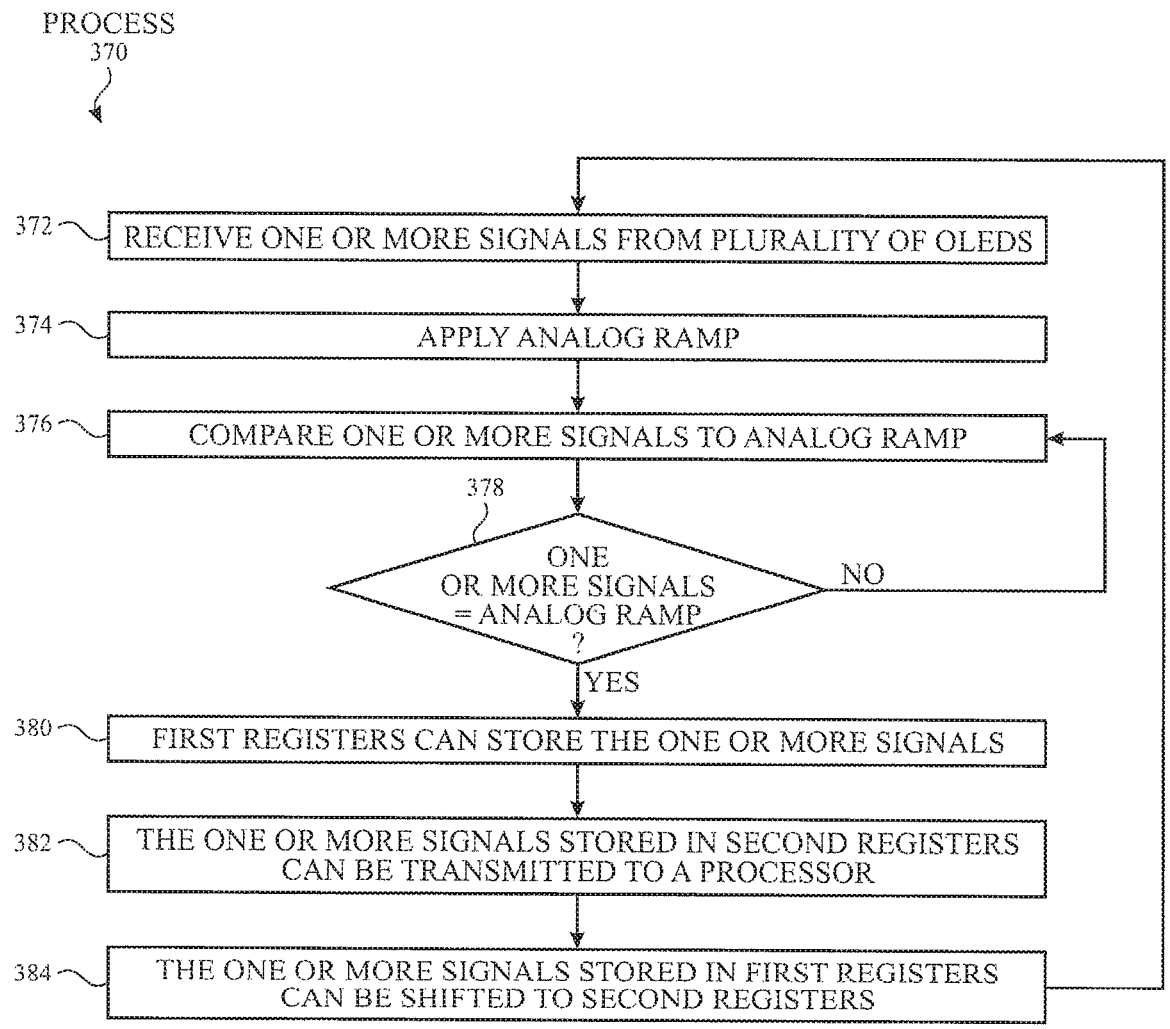
FIG. 3I illustrates an exemplary method for processing optical touch information according to examples of the disclosure.
Figure 3J:
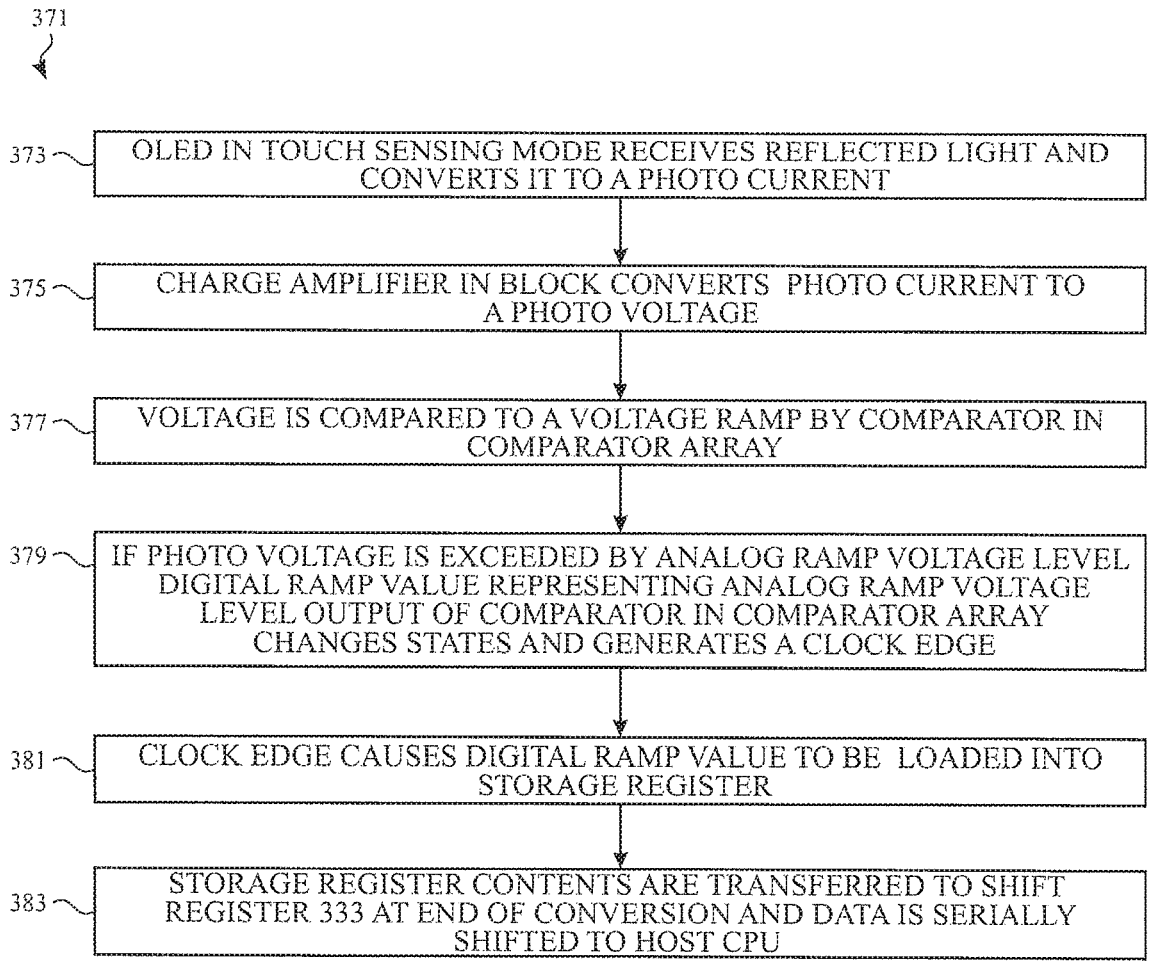
FIG. 3J illustrates an exemplary method for processing optical touch information according to examples of the disclosure.

FIGS. 3H-3J illustrate an exemplary block diagram and exemplary methods for processing optical touch information according to examples of the disclosure. In some examples, plurality of OLEDs 330 can include an array of OLEDs operatively coupled to row driver 312 and circuit 345. Circuit 345 can be configured to sample one or more signals generated by plurality of OLEDs 330. Circuit 345 can include, at least in part, analog front end 310, generator 320, and plurality of registers 338. In some examples, plurality of registers 338 can be output registers configured to shift an output to a host processor of a device including circuit 345.

Analog front end 310 can include sample and hold circuit 314 and comparator array 313. In some examples, sample and hold circuit 314 can also include an array of charge amplifiers. In some examples, sample and hold circuit 314 can sample data from plurality of OLEDs 330. In some examples, the data can include a signal from the output of sample and hold circuit 314. Comparator array 313 can be configured for comparing one or more outputs from sample and hold circuit 314 to a ramp function (e.g., generated by generator 320).

Generator 320 can be configured to provide a ramp function to the comparator array 313. Generator 320 can include counter 321 and a digital-to-analog converter (DAC) 323. In some examples, counter 321 can be an N-bit counter configured to generate a digital ramp. DAC 323 can be configured to convert a digital signal to an analog signal. For example, DAC 323 can convert the output signal from counter 321 to an analog signal. Digitized readings from analog front end 310 can be stored in a plurality of registers 338. The plurality of registers 338 can include registers 331 and registers 333, for example. In some examples, registers 331 can include a plurality of storage registers, and registers 333 can include a plurality of shift registers. Including storage and shift registers in plurality of registers 338 can give circuit 345 the capability of storing conversion results for a currently sampled ADC conversion, while shifting out conversion results from a previously sampled ADC conversion to a processor for further data processing. Registers 331 and registers 333 may form double buffered registers, where register 331 can be updated with conversion results from a currently sampled ADC conversion, and registers 333 can include conversion results from a previously sampled ADC conversion. The previously sampled ADC conversion can be transmitted to a processor in a parallel fashion for further processing. Comparator array 313, ramp generator 320 and output register 331 can form a scalable ADC. It should be understood, that other ADC topologies and arrangements are possible.

One or more rows included in plurality of OLEDs 330 can be configured (e.g., via row driver 312) to detect light reflected off an object in contact with or in close proximity to plurality of OLEDs 330. Each column of plurality of OLEDs 330 can be coupled to analog front end 310 to receive one or more signals (e.g., photocurrents) indicative of a touch or hover event (step 372 of process 370). In some examples, the one or more signals can be received as photocurrents and can be converted to voltage levels by a charge amplifier. DAC 323 can provide a voltage waveform (e.g., analog ramp) to comparator array 313 (step 374 of process 370). Comparator array 313 can compare one or more signals from analog front end 310 to the analog ramp (step 376 and step 378 of process 370). When the voltage level of the analog ramp is greater than the output voltage level from a given charge amplifier in the charge amplifier array, the associated comparator in the comparator array 313 can enable the associated output register 331 of the plurality of registers 338 to store the digital count value from counter 321 (step 380 of process 370). The digital count value can be representative of the sampled voltage level from the charge amplifier array. When registers 331 are enabled (e.g., when the value of the ramp function matches the output from sample and hold circuit 314), the one or more signals stored in registers 333 can be transmitted to a processor or controller (not shown) for analysis (step 382 of process 370). The value(s) stored in the first registers (e.g., registers 331) can be transferred to the second registers (e.g., registers 333), and the contents of registers 333 can be read by a host processor for subsequent processing (step 384 of process 370). The process can be repeated with one or more signals (e.g., from plurality of OLEDs 330) being captured (e.g., by sample and hold circuit 314). Although circuit 345 can be configured to sample plurality of OLEDs 330 in a row-byrow process, examples of the disclosure can include sensing each column with column sense amplifiers or other arrangements.

One or more OLEDs (e.g., OLED 332-1) configured to sense touch can receive reflected light (e.g., from a finger or other proximate object) and convert it to a photocurrent (step 373 of process 371). Charge amplifiers (e.g., amplifier 346 illustrated in FIG. 3C) included in sample and hold circuit 314 can convert a sensed photocurrent into a photo voltage (step 375 of process 371). The voltage can be compared to an analog ramp provided by generator 320 via a comparator included in comparator array 313 (step 377 of process 371). If the photo voltage is exceeded by the analog ramp level (e.g., from DAC 323), the comparator can change states and generate a positive clock edge (step 379 of process 371). The clock edge (e.g., generated by the comparator) can cause the digital ramp value to be loaded into a storage register included in the plurality of registers 331 (step 381 of process 371). The storage register contents can be transferred to shift registers 333 and the data can be serially shifted to a host processor for touch processing (step 383 of process 371).

Figure 3K:
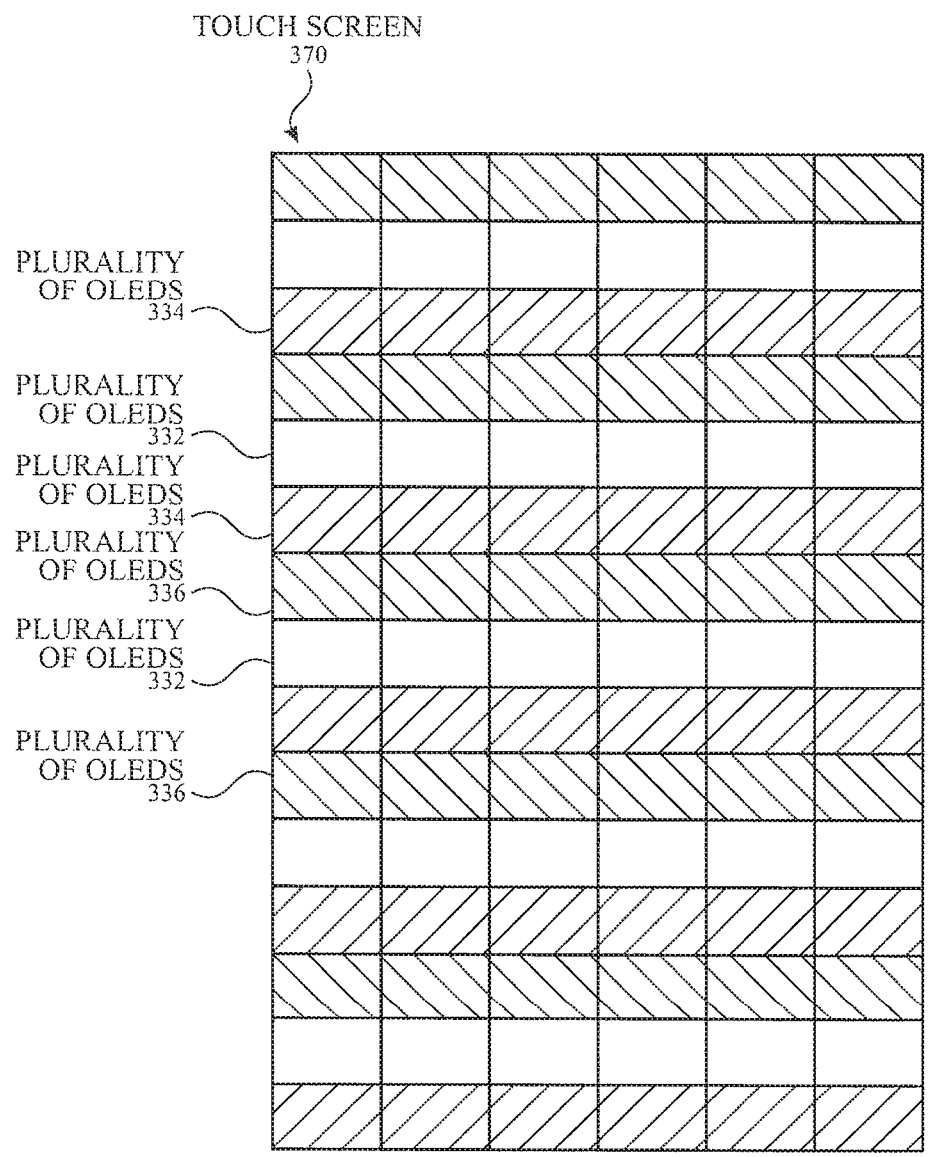
FIG. 3K illustrates a top view of an exemplary touch screen configured for displaying and optical touch sensing using a plurality of OLEDs according to examples of the disclosure.
Figure 3L:
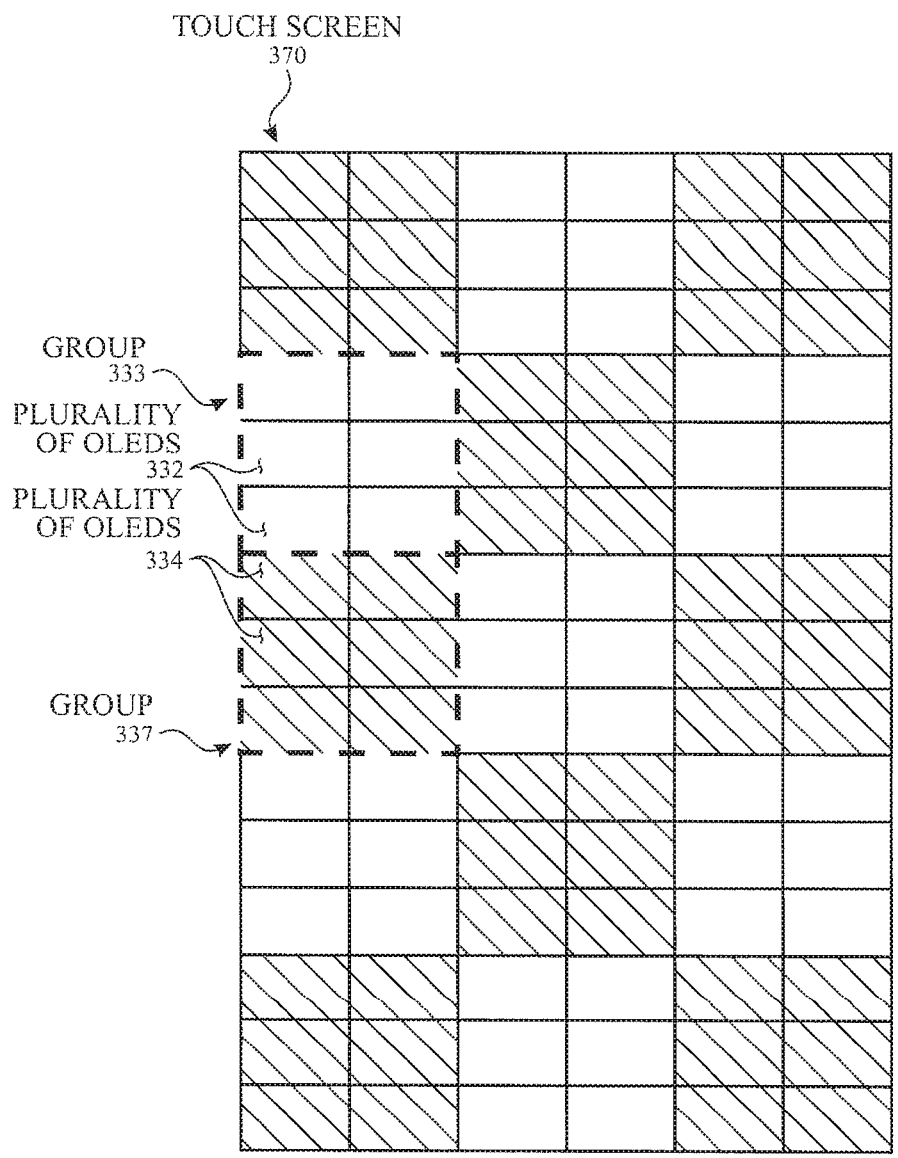
FIG. 3L illustrates a top view of an exemplary touch screen configured for optical touch sensing using a plurality of OLEDs according to examples of the disclosure.

Examples of the disclosure can include other types of arrangements of the plurality of OLEDs. For example, the touch screen can include groups of OLEDs, where each group can be configured to operate in different modes for display and optical touch sensing. FIG. 3K illustrates a top view of an exemplary touch screen configured for displaying and optical touch sensing using a plurality of OLEDs according to examples of the disclosure. Touch screen 370 can include plurality of first OLEDs 334, plurality of second OLEDs 332, and plurality of third OLEDs 336. In some examples, touch screen 370 can be configured to operate in display mode and optical touch sensing mode concurrently.

A first group (e.g., plurality of OLEDs 334) can be configured to operate in emission mode for optical touch sensing. A second group (e.g., plurality of second OLEDs 332) can be configured to operate in sensing mode for optical touch sensing. A third group (e.g., plurality of OLEDs 336) can be configured to operate in emission mode for displaying one or more images. In some examples, to reduce the likelihood of perception by the user, subpixels (e.g., red subpixel, green subpixel, and blue subpixel) formed from the OLEDs operating in the emission mode can be configured to create a touch screen that can appear gray in color to the user. For example, the red subpixel, green subpixel, and blue subpixel can each be configured to emit 50% intensity.

In some examples, touch screen 370 can alternate between display and optical touch sensing modes, where at least one of the groups (e.g., the second group including plurality of OLEDs 332) can be configured to operate in sensing mode while touch screen 370 is operating in display mode. At least two adjacent rows can include OLEDs (e.g., plurality of OLEDs 334 and plurality of OLEDs 336) configured to operate in emission mode. In some examples, one of the groups of OLEDs (e.g., the first group including plurality of OLEDs 334) can alternate between emitting light for display mode and emitting light for optical touch sensing mode.

In some examples, the OLEDs can be arranged to form one or more patterns, such as a checkboard pattern, as illustrated in FIG. 3L. Touch screen 370 can include group 333 and group 337. Group 333 can include a plurality of OLEDs 332, and group 337 can include a plurality of OLEDs 334. In some examples, group 333 can be interleaved (e.g., form a checkerboard pattern) with group 337. During display mode, group 333 and group 337 can be configured to operate in emission mode. During touch sensing mode, group 333 can be configured to operate in emission mode, and group 337 can be configured to operate in sensing mode.

Circuits (e.g., circuit 345 illustrated in FIG. 3H) that sense groups (e.g., columns) of OLEDs serially 345 can be associated with multiple steps for processing the plurality of OLEDs across the touch screen. Although serially sampling the one or more signals can reduce the size of the circuitry, the sampling can take a long time. In some examples, the touch screen can include circuits capable of sampling one or more signals from the plurality of OLEDs simultaneously. Although one or more examples described with reference to FIGS. 3A-3L relate to a touch screen that may not include a capacitive touch sensor, in some instances, a touch screen including a capacitive touch sensor can include one or more of the systems or methods described with reference to FIGS. 3A-3L.

Figure 4A:
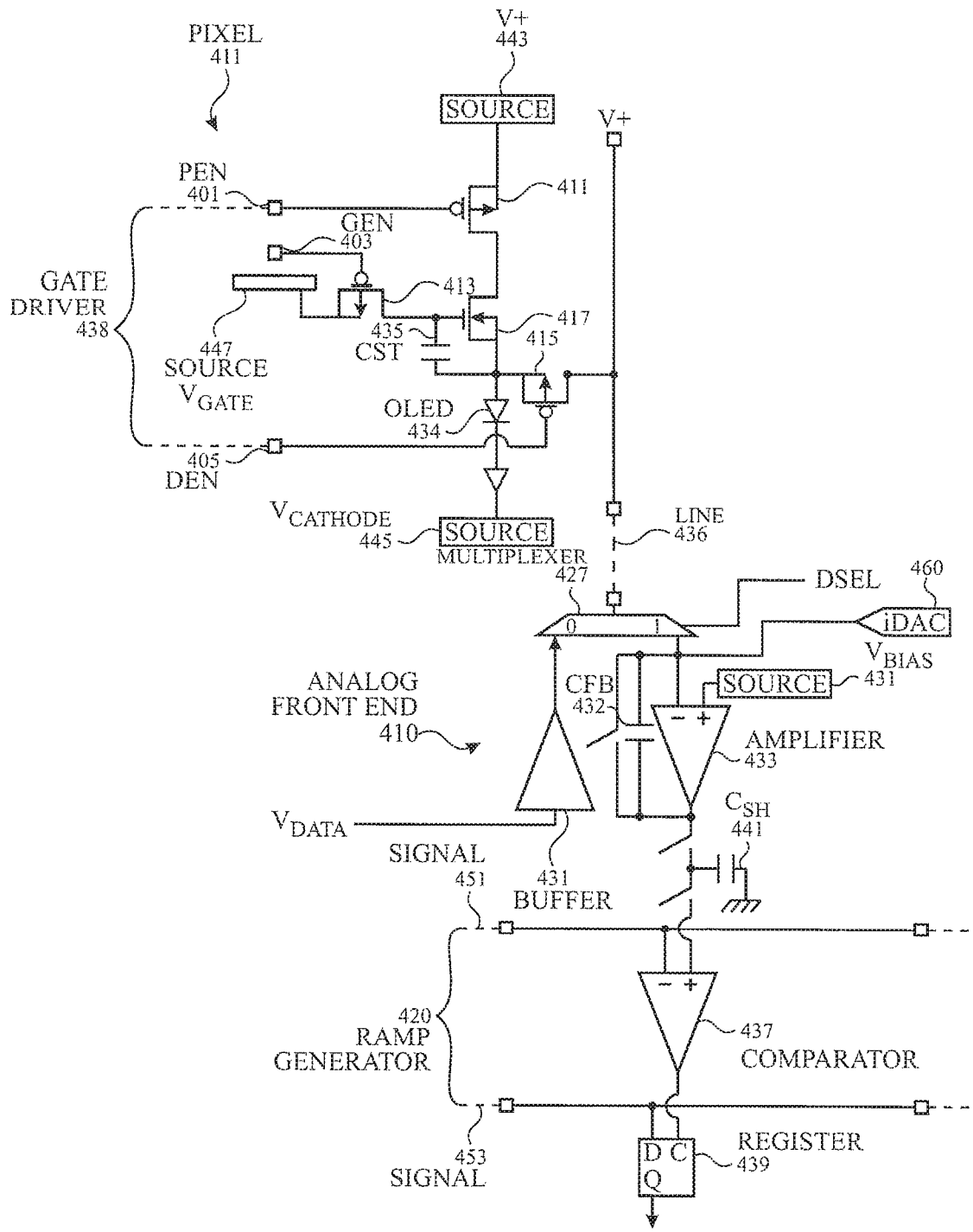
FIG. 4A illustrates an exemplary circuit for optical touch sensing according to examples of the disclosure.

FIGS. 4A-4B illustrate an exemplary circuit and an exemplary table for optical touch sensing according to examples of the disclosure. Pixel 411 can include OLED 434 coupled to a gate driver 438. Gate driver 438 can include a plurality of sources (e.g., voltage sources), storage capacitor $C_{ST}$ 435, and a plurality of transistors. OLED 434 can be switchably operable to emit and detect light, for example. OLED 434 can operate similarly to OLED 332-1 and/or OLED 334-1 described with reference to FIGS. 3A-3J. The plurality of sources can include source 443, source 445, and source 447. In some examples, the plurality of sources can be voltage sources. Storage capacitor $C_{ST}$ 435 can be configured to store a charge. The plurality of transistors can include transistor 411, transistor 413, transistor 415, and transistor 417. In some examples, transistor 411, transistor 413, and/or transistor 415 can be PMOS transistors. In some examples, transistor 417 can be a NMOS transistor. The plurality of transistors can be configured to couple one or more lines together. For example, the gate of transistor 411 can be coupled to pixel enable PEN 401; the source of transistor 411 can be coupled to source 443; and the drain of transistor 411 can be coupled to the drain of transistor 417. The gate of transistor 417 and the drain of transistor 413 can be coupled to $C_{ST}$ 435. The drain of transistor 417 and the source of transistor 415 can be coupled to the anode of OLED 434. The gate of transistor 413 can be coupled to gate enable GEN 403, and the source of transistor 413 can be coupled to source 447. The gate of transistor 415 can be coupled to data enable DEN 405, and the drain of transistor 415 can be coupled to line 436.

Although FIG. 4A illustrates transistor 411, transistor 413, and transistor 415 as PMOS transistors and transistor 417 as a NMOS transistor, examples of the disclosure can include any type of switch configured with any orientation. For example, transistor 411, transistor 413, transistor 415, and transistor 417 can be MOSFETS with reversed polarities. For example, one or more PMOS (e.g., transistor 411, transistor 413, and transistor 415) transistors can replace one or more NMOS transistors, one or more NMOS transistors (e.g., transistor 417) can replace one or more PMOS transistors, and/or the control signals can be switched accordingly. In some examples, non-transistor switches can be used.

In some examples, OLED 434 can be coupled to analog front end 410 to optically sense touch. Analog front end 410 can include multiplexer 427, buffer 431, amplifier 433, iDAC 460, comparator 437, and register 439. In some examples, register 439 can be a multi-bit (e.g., "N" bit) storage register. In some examples, each analog front end 410 can be coupled to one pixel 411 or one column of pixels.

OLED 434 can be configured to operate in any number of modes including, but not limited to, display mode, emission mode (for optical touch sensing), and sensing mode. FIG. 4B illustrates exemplary functions associated with the OLED modes. The mode can be selected based on the signal lines (e.g., pixel enable PEN 401, gate enable GEN 403, data enable DEN 405, and data select DSEL 407).

During a display mode, the OLEDs can be updated by configuring pixel enable PEN 401 high, gate enable GEN 403 low, data enable DEN 405 low, and data select DSEL 407 low. Transistor 411 can decouple V+ source 443 from transistor 417, allowing source 447 to update $C_{ST}$ 435, and the anode of OLED 434 can receive charge from $C_{ST}$ 435. Transistors 413 and 415 can be enabled, allowing storage capacitor $C_{ST}$ to be charged to a voltage VGS equivalent to the difference between $V_{DATA}$ and $V_{GATE}$. In some examples, $V_{CATHODE}$ 445 may have a low enough value to ensure OLED 434 is not forward biased. $V_{DATA}$ can be propagated from buffer 431 through multiplexer 427 to line 436. Display mode can be similar to the emission mode for optical touch sensing. That is, all switches can be off, except transistor 411, which can allow transistor 417 to generate a current through the OLED 434 that is set by the gate to source voltage of transistor 417 equivalent to the voltage across $C_{ST}$.

During the emission mode for optical touch sensing, the OLEDs 434 can be driven such that light with an intensity based on the current through the OLED can be emitted. The current through the OLED can be generated by transistor 417 and storage capacitor $C_{ST}$ 435. In some examples, pixel enable PEN 401 can be low, and data enable DEN 405 can be high. Transistor 411 can electrically couple source V+ 443 to the source of transistor 417. The drain of transistor 417 can be coupled to the anode of OLED 434. The cathode of OLED 434 can be coupled to the cathode source 445. Source 443 and cathode source 445 can be configured such that OLED 434 can be forward biased (e.g., for optical touch sensing as described with reference to FIGS. 3A-3J and FIGS. 7A-7B). Transistor 415 can electrically decouple the anode of OLED 434 from line 436, thereby preventing analog front end 410 from receiving one or more signals from OLED 434, for example.

During the sensing mode for optical touch sensing, pixel enable PEN 401 can be high, gate enable GEN 403 can be high, data enable DEN 405 can be low, and data select DSEL 407 can be high. Transistor 411 and transistor 413 can electrically decouple source V+ 443 and source $V_{GATE}$ 447, respectively, from the circuit. Transistor 415 can electrically couple the anode of OLED 434 to analog front end 410 via line 436. OLED 434 can detect light and can generate one or more signals, which can be transmitted on line 436. In some examples, OLED 434 can generate a photocurrent that can be a function of the intensity of the received light. The photocurrent can be propagated via line 436 through multiplexer 427 to a charge amplifier. The charge amplifier can comprise amplifier 433, CFB 432, and Vbias 431. Charge amplifier can convert the signal (e.g., a photocurrent) to a voltage. iDAC 460 can be used to compensate for any leakage or offset currents into the inverting terminal of amplifier 433 in order to improve dynamic range, for example. In some examples, leakage or offset currents can be induced by disabled transistors 415 along line 436. Capacitor $C_{SH}$ 436 can sample and hold the one or more signals.

Analog front end 410 can receive signal 451 and signal 453 from generator 420. In some examples, generator 420 can be a ramp generator, and signal 451 and signal 453 can include a ramp function. In some examples, comparator 437 can receive signal 451 and an input from amplifier 433 (and/or capacitor $C_{SH}$ 441). Comparator 437 can compare signal 451 and one or more signals from amplifier 433 (and/or capacitor $C_{SH}$ 441). When signal 451 matches the one or more signals from $C_{SH}$ 441, comparator 437 can enable signal 453 to be stored in register 439. In some examples, signal 453 can be indicative of the one or more signals sampled from the plurality of OLEDs. Controller 440 can receive the output from register 439 and can perform analysis.

Figure 5:
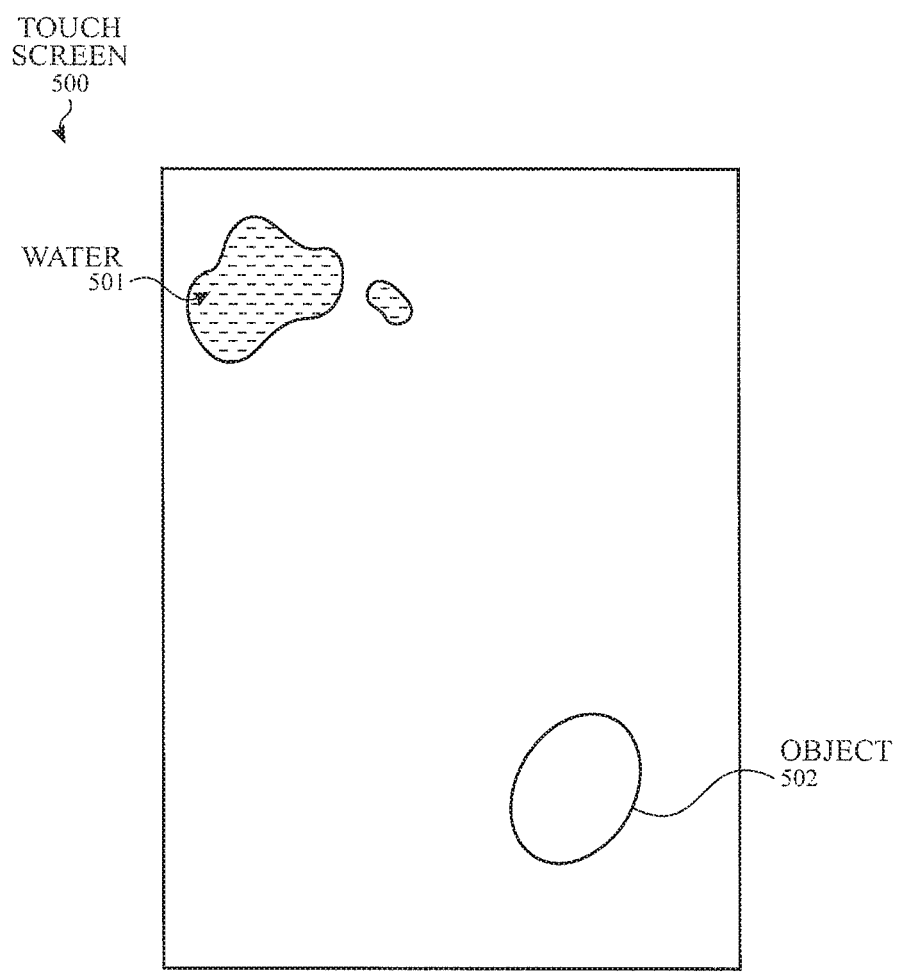
FIG. 5 illustrates a top view of an exemplary touch screen with one or more objects in contact with its surface according to examples of the disclosure.

In some examples, optical touch sensing can identify an object in contact with a touch screen based on its optical properties. FIG. 5 illustrates an exemplary touch screen with one or more objects in contact with its surface according to examples of the disclosure. In some examples, one or more objects, such as water 501 and object 502, can be touching a surface of touch screen 500. In some examples, a touch screen 500 can be capable of differentiating between water 501 from object 502. In this manner, touch screen 500 can accurately reject signals associated with water 501 while accepting signals associated with object 502. This may be unlike some capacitive touch sensors (e.g., mutual capacitance based touch sensors), which may erroneously mistake water 501 as user input due to the conductive properties of water 501, for example.

In addition to or instead of discerning water from objects based on the differences in footprint (e.g., a finger object may have an oval shaped footprint), touch screen 500 can discern different objects based on differences in one or more optical properties. For example, water can have an absorption band around 1700 nm, whereas a finger object can have an absorption band around 1000-1500 nm. In some examples, water 501 and object 502 can have different spectral "fingerprints." A spectral fingerprint can include the absorbance (or reflectance) values across a spectrum of wavelength (e.g., visible range). Water 501 and object 502 can include different types of materials, which may lead to differences in spectral "fingerprints." Based on the frequency of the reflected light or spectral "fingerprint" detected by the plurality of OLEDs, a processor or controller can determine the type of object.

In some examples, water can be distinguished from a finger object by performing one or more optical touch scans with emitting light having object-specific frequencies (e.g., a scan outside of 1700 nm may not detect water or a scan outside of 1000-1500 nm may not detect a finger). Additionally or alternatively, one or more narrowband filters can be applied, where the narrowband filter can include or exclude one or more object-specific frequencies.

In some examples, light reflected off water 501 can have a different level of transparency (e.g., percent reflectance) and/or heterogeneity properties than object 502. For example, object 502 can be a finger, which can be opaque and can have heterogeneous optical properties, while a drop of water may be more transparent and can have homogeneous optical properties.

The touch screen can determine the location(s) of water 501 and/or object 502 using optical touch sensing or capacitive touch sensing (discussed below$_{[shs31]}$). In some examples, capacitive touch sensors can be employed to determine the location of the object(s), and optical touch sensing can be employed to determine whether the contact is from water or another object (e.g., a finger). In some examples, determining whether the contact is from water or another object can include utilizing only those touch sensors positioned at the determined location(s). In some examples, a processor or controller can ignore any contacts from water.

Figure 6A:
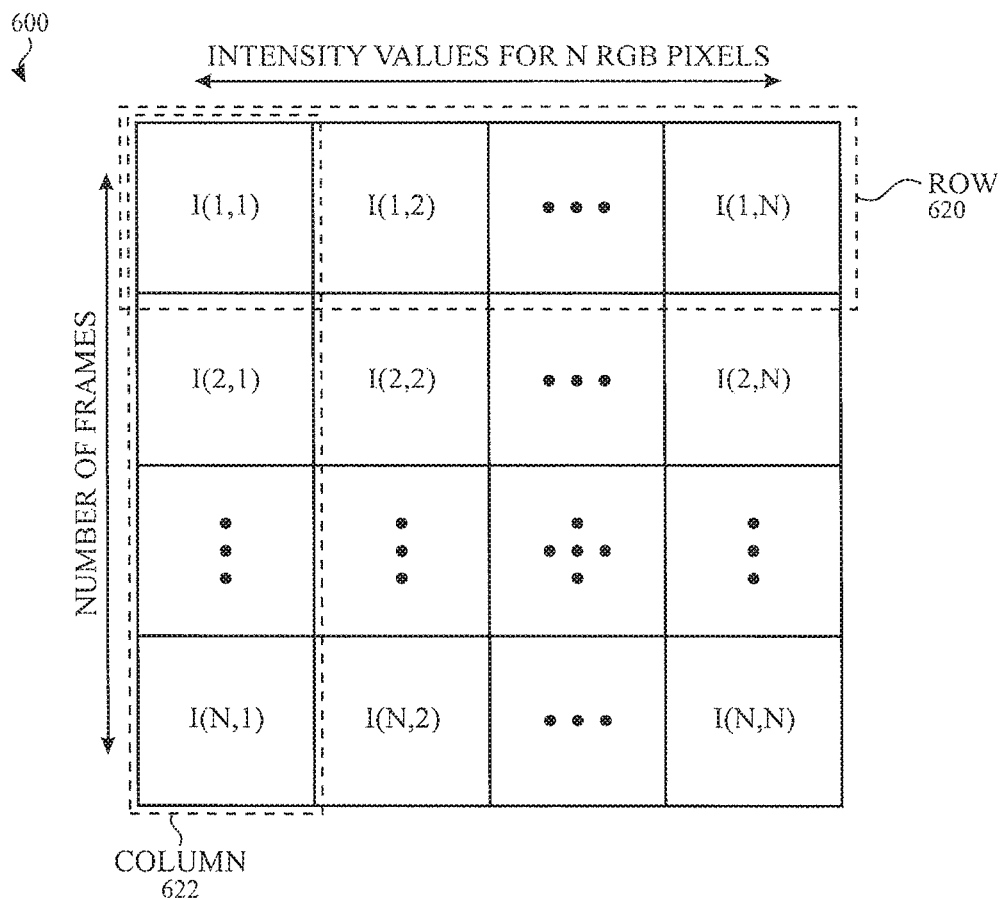
FIG. 6A illustrates an exemplary matrix for temporally modulating a plurality of OLEDs according to examples of the disclosure.

In addition to water rejection, examples of the disclosure can include configuring OLEDs for noise rejection. In some examples, noise can include ambient light, stray light from other OLEDs or other sensors, and/or light from multiple reflections off the object (e.g., finger) and/or device stackup. The OLEDs can be temporally and/or spatially modulated for noise rejection. FIG. 6A illustrates an exemplary matrix for temporally modulating a plurality of OLEDs according to examples of the disclosure. Matrix 600 can include plurality of rows 620 and plurality of columns 622. In some examples, the number of columns 622 can be equivalent to the number of OLEDs in each row. For example, each OLED can be associated with a pixel, where a pixel can include a red display sub-pixel, a green display sub-pixel, and a blue display sub-pixel. The number of rows 620 can be equal to the number of frames for optical touch sensing, for example. In some examples, the number of columns 622 can be equal to the number of rows such that matrix 600 can be a square matrix. One or more rows of OLED pixels (e.g., including OLEDs 334 illustrated in FIGS. 3B-3D, 3G, 3K, and 3L) can be configured to operate in the emission mode and can be spatially modulated with a spreading code represented by matrix 600 at a given time. One or more rows of OLEDs (e.g., OLEDs 332 illustrated in FIGS. 3B-3D, 3G, 3K, and 3L) can be configured to operate in sensing mode and can be demodulated with another matrix. In some examples, the other matrix can be the inverse of matrix 600. In some examples, demodulation of the OLEDs can be performed after charge amplification and before the one or more signals pass through analog-to-digital circuits.

In some examples, matrix 600 can be a Walsh-Hadamard matrix. Other types of encoding are possible. In some examples, matrix 600 can be a rectangular matrix, and other methods of demodulation can be used. In some examples, spatial modulation can be used to differentiate light emitted by one or more OLEDs. For example, at a first time, the first row of OLEDs can be configured to operate in display mode with modulated intensities represented by the first row 620 of the matrix 600 (e.g., I(1,1), I(1,2), . . . I(1,N)).

Figure 6B:
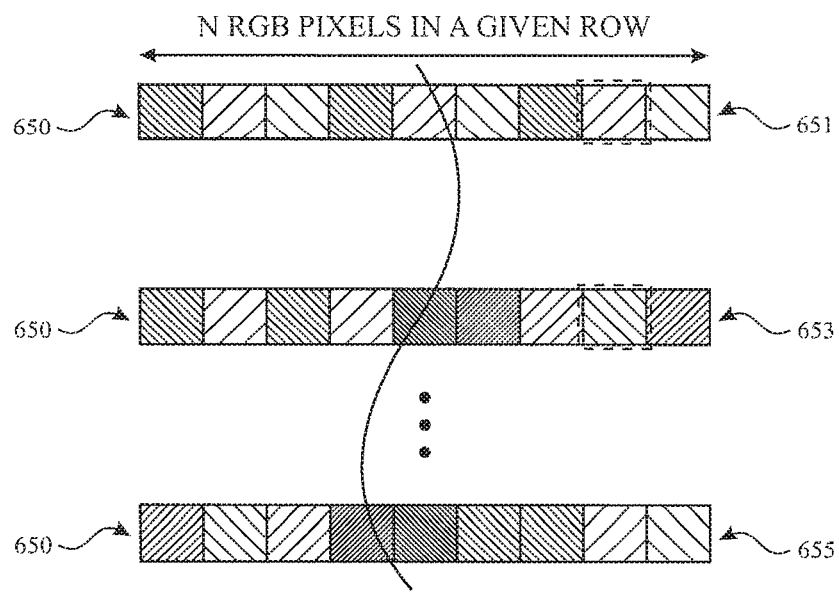
FIG. 6B illustrates an exemplary sequence of temporally-modulated light for one row of OLEDs according to examples of the disclosure.

FIG. 6B illustrates an exemplary sequence of temporally-modulated light for one row of OLEDs according to examples of the disclosure. A row of OLEDs can be configured to operate in display mode by emitting temporally modulated light. That is, during N frames, a modulation sequence (e.g., one or more waveforms) can be applied to row 650 of OLEDs. During a first frame, the modulation sequence can have a first set of N intensity values I(1,1), I(1,2), . . . I(1,N), respectively. During a second frame 653, the modulation sequence of row 650 can have a second set of N intensity values I(2,1), I(2,2), . . . I(2,N), respectively. During the last frame 655, the modulation sequence can have a nth set of N intensity values I(N,1), I(N,2), . . . I(N,N), respectively. In this manner, each OLED can be modulated with a unique spreading code across N frames.

The spreading code for each of the N OLEDs can be orthogonal to the spreading code of the other OLEDs. In some examples, the modulated reflected light from N OLEDs configured to operate in emission mode can be received by N OLEDs configured to operate in sensing mode. The modulated signal from the OLEDs configured to operate in sensing mode can be demodulated with a de-spreading code, which can be derived by inverting matrix 600. Matrix 600 can be configured such that the spreading code for each OLED configured to operate in emission mode (and associated de-spreading code for the optically coupled OLED configured to operate in sensing mode) can be orthogonal to that of other OLEDs configured to operate in emission mode, therefore minimizing crosstalk between optically coupled OLEDs.

In some examples, modulation of the OLEDs can include both temporal and spatial modulation. For example, the OLEDs in one row can be modulated by a first row 620 of matrix 600, while the OLEDs in another row can be modulated by a different row 620 of matrix 600 during one frame. In the next frame, for example, each row of OLEDs can be modulated by a different row 620 of matrix 600 than the last frame, such that one or more OLEDs can be modulated with a unique, but predictable pattern. Due to the pattern being predictable and unique, a processor or controller can differentiate between light emitted by the OLEDs and light from noise sources (e.g., ambient light, stray light from other sensors, and/or light due to multiple reflections from the object and/or device stackup). In some examples, each waveform included in matrix 600 can be different from neighboring waveforms to improve pixel separation, which can make it easier to separate neighboring pixels and to determine which OLED the reflected light originated from.

Figure 7A:
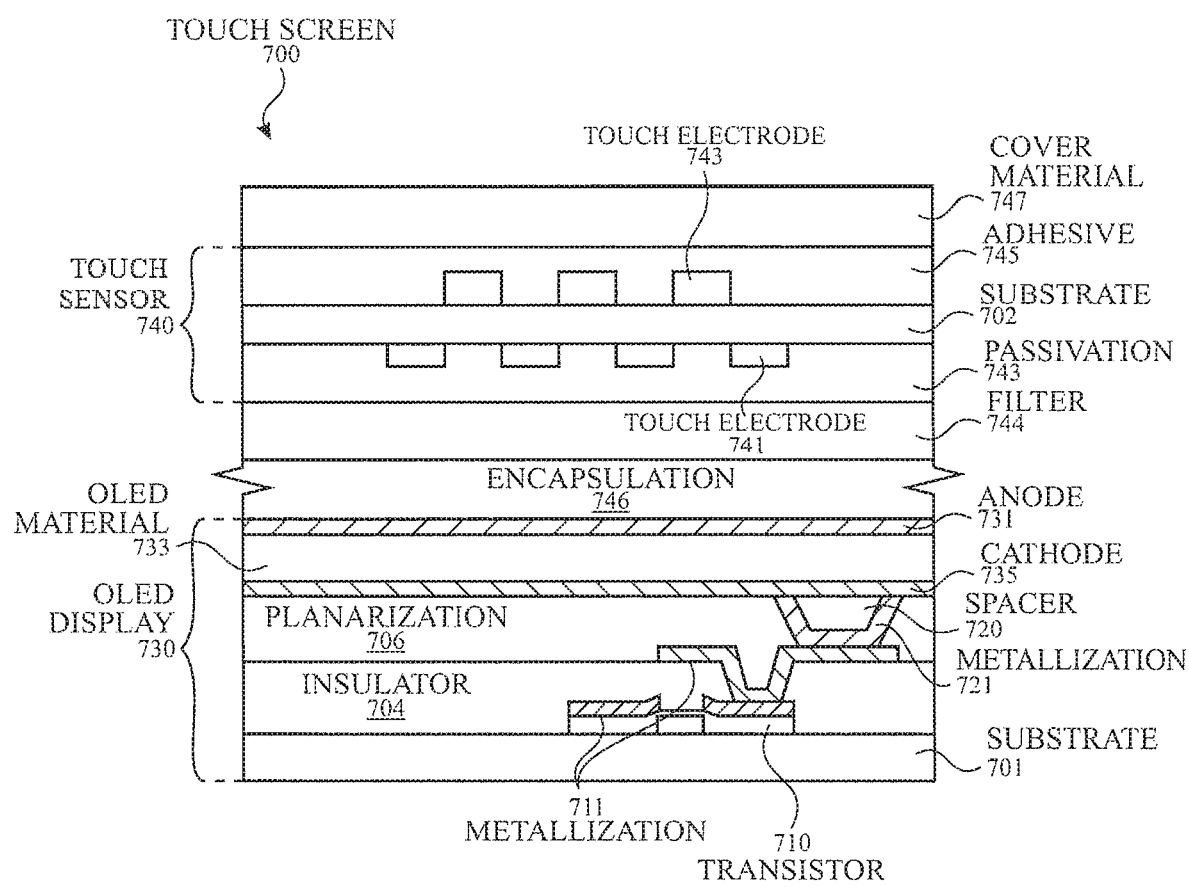
FIG. 7A illustrates a cross-sectional view of an exemplary touch screen including touch electrodes configured for capacitive touch sensing and a plurality of OLEDs configured for optical touch sensing according to examples of the disclosure.

FIG. 7A illustrates a cross-sectional view of an exemplary touch screen configured for capacitive touch sensing with a touch sensor and optical touch sensing using a plurality of OLEDs according to examples of the disclosure. Touch screen 700 can include cover material 747, OLED display 730, touch sensor 740, filter 744, and encapsulation 746. Cover material 747 can be configured for protecting one or more layers included in touch screen 700 while allowing a user of the touch screen to view a displayed image and/or perform an operation and/or action by touching a surface of the touch screen. In some examples, cover material 747 can be attached to the one or more layers of touch screen 700 using adhesive 745 (e.g., an optically clear adhesive (OCA)).

OLED display 730 can be configured for displaying one or more images and/or optical touch sensing. OLED display 730 can include transistor 710, metallization 711 and 721, insulator 704, planarization 706, spacer 720, cathode 735, OLED material 733, and anode 731 deposited on substrate 701. Substrate 701 can be configured for supporting OLED display 730.

Transistors 710 can be included in a plurality of individually addressable transistors, where each transistor 710 can be coupled to a pixel. In some examples, transistor 710 can be a thin-film transistor (TFT). Transistor 710 can include any type of switch configured for activating (or deactivating) a pixel. Transistor 710 can include a gate, a source connected to a voltage source, and a drain connected to cathode 735. Metallization 711 and 721 can be any type of conductor configured for routing a voltage signal, for example, between transistor 710 and cathode 735. Insulator 704 and planarization 706 can be configured for insulating transistor 710 and any additional transistors (not shown) included in touch screen 700, for example. Spacer 720 can be configured to maintain sufficient distance between cathode 735 and transistor 710 to minimize any damage to OLED display 730 that can be created from external forces applied to touch screen 700.

Further, although FIG. 7A illustrates an exemplary touch screen 700 including OLED stackup 730, additional components can be included in an OLED stackup according to examples of the disclosure. For example, an OLED stackup can include one or more color filters located between OLED material 733 and cover material 747 (e.g., for displaying a plurality of colors using white OLED elements). Although FIG. 7A illustrates cathode 735 as electrically coupled to transistor 710 with anode 731 disposed on a top side of OLED material 733, in some examples, the polarity of the OLED stackup can be reversed. That is, an anode can be electrically coupled to one or more transistors with a cathode located on the top side of the OLED material.

Touch sensor 740 can include passivation 743, touch electrode 740, and touch electrode 743 deposited on substrate 702. In some examples, touch electrode 741 and touch electrode 743 can be configured as a capacitive touch sensor to sense a self- or mutual capacitance indicative of an object proximate to or touching the touch screen. In some examples, touch electrode 741 and touch electrode 743 can be made of ITO or another suitable conductive material.

Touch screen 700 can further include filter 744. Filter 744 may be needed to enhance the accuracy of the optical touch sensing measurements. Cover material 747 may be designed for a wide viewing angle. While the wide viewing angle may enhance the user's viewing experience, it may lead to light emitted by the OLEDs causing multiple reflections at one or more interfaces of the device's stackup. The multiple reflections can be sensed by other sensors, which can lead to erroneous measurements and the inability to resolve fine features.

Filter 744 can be any type of filter configured to change one or more optical properties of light emitted from OLED material 733. For example, filter 744 can focus light emitted from OLED display 730. In some examples, filter 744 can focus the light to certain locations (e.g., predicted spots where one or more undulations may be located). In some examples, filter 744 can be configured to reduce stray light from other sensors and/or the reflections from the device stackup. In some examples, filter 744 can change one or more properties (e.g., angle of incidence, beam size, and/or intensity) of light such that a finer resolution (than capacitive touch sensing) can be achieved. One or more properties (e.g., material, thickness, refractive index, number of layers) of filter 744 can be selected based on pixel dimensions, pixel pitch, optical properties of the stackup, number of layers in the stackup, the properties of the OLED material, touch feature resolution size (e.g., undulation in a fingerprint), conversion time per row, object size, and/or a frame rate of touch screen 700. In some examples, the filter can include a plurality of layers, where each layer can be separated from another layer by at least a substrate (e.g., substrate 702), a layer included in the stackup of touch sensor 740, and/or a layer included in the stackup of OLED display 730.

In some examples, OLED display 730 can be configured for displaying one or more images during one time period and can be configured for touch sensing during another time period. To display an image, a current can be passed through the OLED, where the current is a function of the intensity level of the displayed image at the location of the OLED. In some examples, the current through OLED can be the same during display and optical touch modes. In some examples, the current through OLED can be the different during display and optical touch modes. For example, the currents passed through the OLEDs during the display mode can be based on the intensity of one or more display images, whereas the currents passed through the OLEDs during the optical touch mode can be based on the intensity values in matrix 600.

Figure 7B:
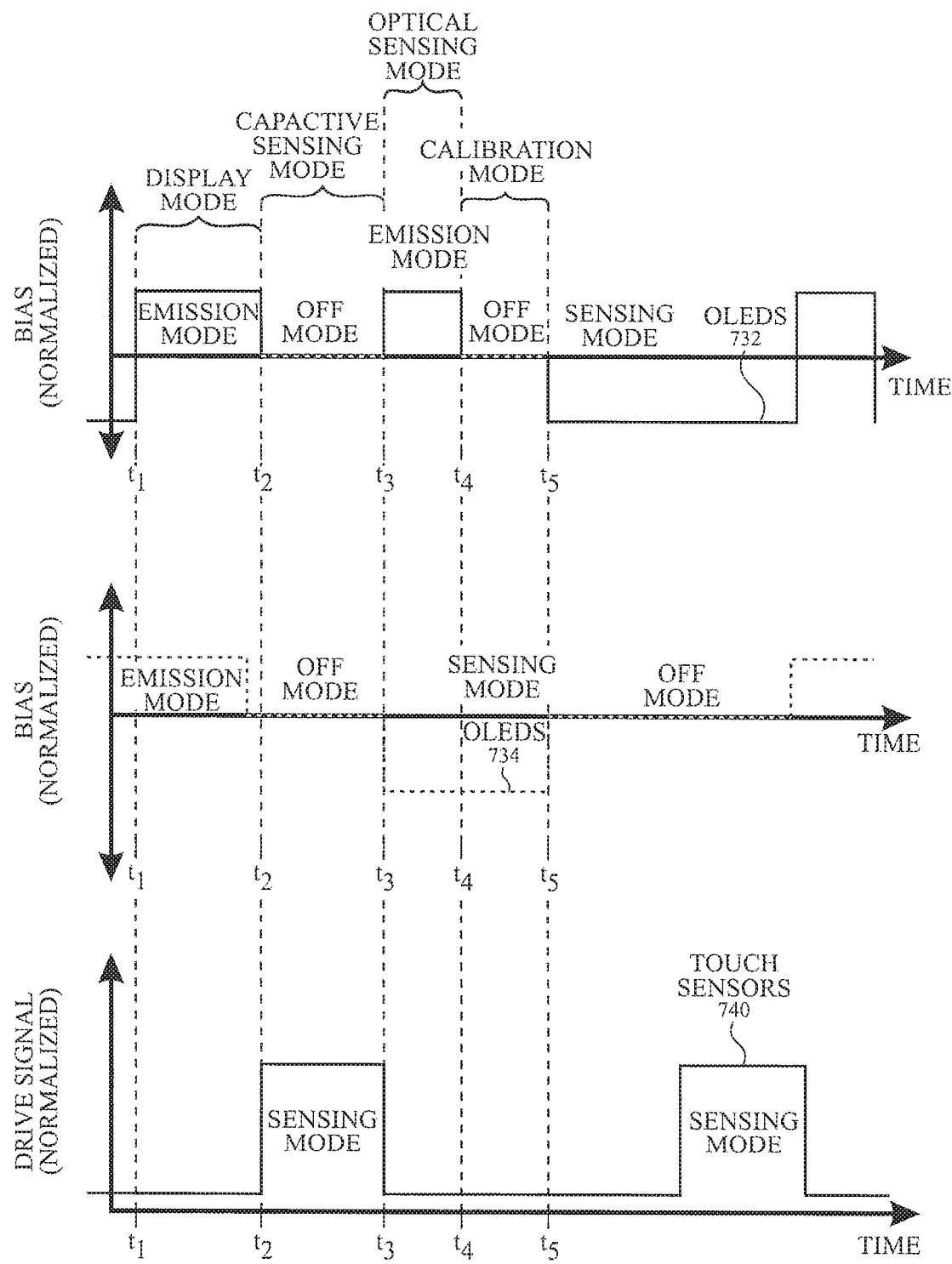
FIG. 7B illustrates an exemplary method for capacitive and optical touch sensing according to examples of the disclosure.

For touch sensing, touch screen 700 can be configured for capacitive touch sensing and/or optical touch sensing. In some examples, touch screen 700 can be configured for capacitive touch sensing for coarse determination (e.g., location) of an object in close proximity or touching touch screen 700 and optical touch sensing for fine determination (e.g., fingerprint resolution). FIG. 7B illustrates an exemplary timing diagram for capacitive and optical touch sensing according to examples of the disclosure.

At a time $t_1$, the touch screen can be configured to in a display mode by configuring both OLED 732 and OLED 734 to operate in the emission mode. At time $t_2$, the touch screen can be configured in capacitive sensing mode by configuring touch sensor 740 to capacitively couple to the touch object using, for example, drive circuitry supplying one or more drive signals. At time $t_3$, the touch screen can be configured in an optical sensing mode by configuring OLED 732 to operate in the emission mode and OLED 734 to operate in the sensing mode. At time $t_5$, the touch screen can be configured in a calibration mode. OLED 734 can be configured in the off mode (e.g., electrically decoupled from both drive and sense circuitry). OLED 732 can be configured to operate in the sensing mode. The calibration procedure is described in more detail with reference to FIG. 8C (below).

Figure 7C:
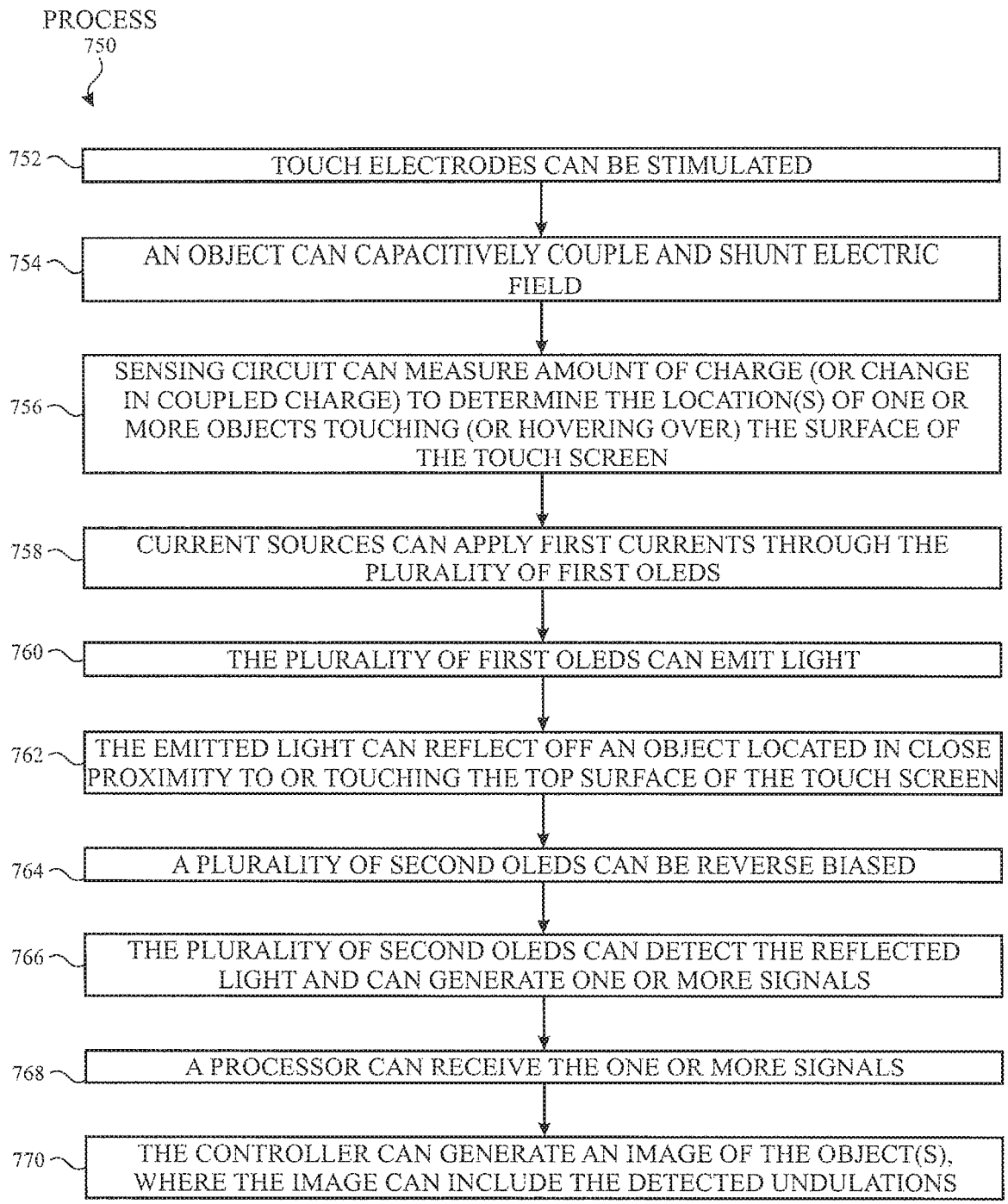
FIG. 7C illustrates an exemplary timing diagram for capacitive and optical touch sensing according to examples of the disclosure.

For mutual capacitive touch sensing (e.g., when the touch screen is in capacitive sensing mode shown between time $t_2$ and time $t_3$ illustrated in FIG. 7C), the sensing device can include two layers (e.g., touch electrode 741 and touch electrode 743 illustrated in FIG. 7A) of spatially separated conductive sections. One layer can include sections arranged as rows, while the other layer can include sections arranged as columns (e.g., orthogonal). Sensing nodes can be formed at intersections of the rows and columns.

In some examples, capacitive sensing mode can include self-capacitive touch sensing, the layers (e.g., touch electrode 741 and touch electrode 743) of spatially separate conductive sections can each be driven and have its self-capacitance sensed. In other examples, a touch screen can include pixelated self-capacitance electrodes in one layer. Each pixelated electrode can correspond to a unique part of the touch screen and be driven and have its self-capacitance sensed.

FIG. 7C illustrates an exemplary timing diagram for capacitive and optical touch sensing according to examples of the disclosure. For capacitive touch sensing, a first one or more touch electrodes can be stimulated and charged (step 752 of process 750). In a mutual capacitance touch screen, the charge can capacitively couple to a second one or more touch electrodes at the sensing nodes. As an object (e.g. a finger) approaches the surface of touch screen 700, the object can shunt some of the electric field to reduce the charge of the electrodes (step 754 of process 750). The reduction of charge can be sensed as a change in mutual or self-capacitance. The amount of charge (or change in coupled charge) in each of the columns can be measured by a sense circuitry, coupled to one or more touch electrodes, to determine the location(s) of one or more objects when touching (or hovering over) the surface of touch screen 700 (step 756 of process 750).

Although touch screen 700 includes two touch electrode layers, each including touch electrode 741 and touch electrode 743, for example, touch screen 700 can include any number of layers. In some examples, other types of touch sensors can be included. Accordingly, many different configurations and touch sensing technologies can be employed without departing from or with respect to claimed subject matter scope. For example, a touch sensor configuration can utilize, but is not limited to, touch sensing technologies that employ resistive, surface acoustic, self-capacitance, mutual capacitance, or any combinations thereof.

For optical touch sensing, a first plurality of OLEDs (e.g., plurality of OLEDs 334 illustrated in FIG. 3B) can be configured for emitting light towards the cover material (e.g., cover material 747). Current sources (e.g., ICS1 and ICS2 illustrated in FIG. 3C) can inject currents into the plurality of first OLEDs (step 758 of process 750). In some examples, currents can be injected to OLEDs at only those locations determined from the capacitive touch measurement (e.g., steps 752-756). The plurality of first OLEDs (e.g., OLEDs 334) can emit light (step 760 of process 750). In some examples, the plurality of second OLEDs (e.g., OLED 332-1) can be deactivated, while the plurality of first OLEDs are configured to operate in emission mode. Deactivating the plurality of second OLEDs can include decoupled the second OLEDs (e.g., using second switch S4 illustrated in FIG. 3C) from sense circuitry (e.g., amplifier 346, Vbias 347, and capacitor 348 illustrated in FIG. 3C). In some examples, the plurality of second OLEDs can be activated, but signals measured from the plurality of second OLEDs can be ignored.

The emitted light (e.g., from OLEDs 334) can reflect off one or more undulations (e.g., ridges of a finger) of the object located in close proximity to or in contact with a surface of cover material (e.g., cover material 747 illustrated in FIG. 7A) (step 762 of process 750).

A reverse bias can be applied to a plurality of second OLEDs (step 764 of process 750) by closing a switch (e.g., first switch S3 illustrated in FIG. 3C) to couple the second OLED to sense circuitry (e.g., amplifier 346, Vbias 347, and capacitor 348 illustrated in FIG. 3C). By applying a reverse bias to the plurality of second OLEDs (e.g., OLEDs 332), the second OLED can be configured to detect the reflected light and can generate one or more signals (step 766 of process 750). The controller (not shown) can receive the one or more signals and can determine one or more touch (and/or hover) information (step 768 of process 750). In some examples, the controller can generate a 2-D image of the object(s), where the image can include the detected undulations (step 770 of process 750).

In some examples, a calibration (i.e., baseline) procedure (discussed below) can be performed at any time (e.g., at time $t_3$ illustrated in FIG. 3D or at time $t_5$ illustrated in FIG. 7B). By time multiplexing the display mode, capacitive sensing mode, optical touch sensing mode, and calibration mode, the touch screen can perform one or more operations with limited interference. For example, the touch screen can be in the calibration mode at a different time than in the optical touch sensing mode, such that the touch screen's determination of baseline values can be unaffected by stray light from other sensors and/or light due to multiple reflections from the object and/or device stackup. In some examples, the mode can be different in different regions of the touch screen. For example, the touch screen can be configured to sense a touch in one region of the active area, while being simultaneously configured to display one or more images in a different region of the active area. In some examples, one or more first operations can be repeated before performing a second operation. For example, a display operation and a touch sensing operation can be repeated multiple times before performing a calibration procedure.

Capacitive touch sensing can be suitable for detecting the location of one or more touch objects, but the resolution of capacitive touch sensing may not be suitable for resolving fine features (e.g., undulations in a finger). For example, a finger may have undulations that are less than 100 µm in size and may be detected using a sensor including a specific high dielectric constant material. The high dielectric constant material may be able to focus the electric fields to resolve the fine features. However, the high dielectric constant material may have limited applicability (e.g., fingerprint detection), limiting the size (e.g., size of home button 134 illustrated in FIG. 1A) and/or location (e.g., outside of the active area) of the sensor. Furthermore, in some examples, fidelity of an acquired optical touch image for finger print recognition can be compromised by stray reflections either from a proximate object (e.g., the finger) to be imaged or stray reflections that occur inside the optical medium (e.g. touch sensor, etc.). Since the OLED emitter can have light diffusion characteristics, it can emit light in various angles, for example. Light that is not directed toward the object (e.g., finger) above the touch sensor can illuminate unintended areas of the object and induce secondary (multi-path) reflections. These secondary reflections can wash out or reduce the contrast of the image, for example. In some examples, to provide a touch screen with provisions for mitigating stray OLED light.

Figure 8A:
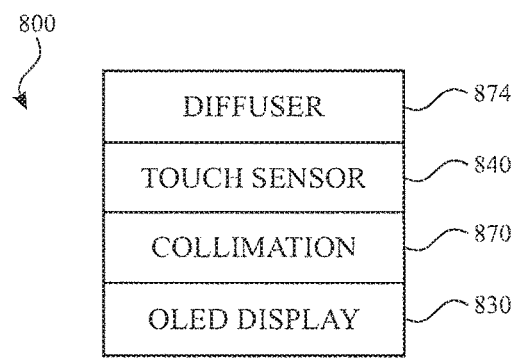
FIGS. 8A-8B illustrate cross-sectional and top view of an exemplary touch screen for user identification according to examples of the disclosure.
Figure 8B:
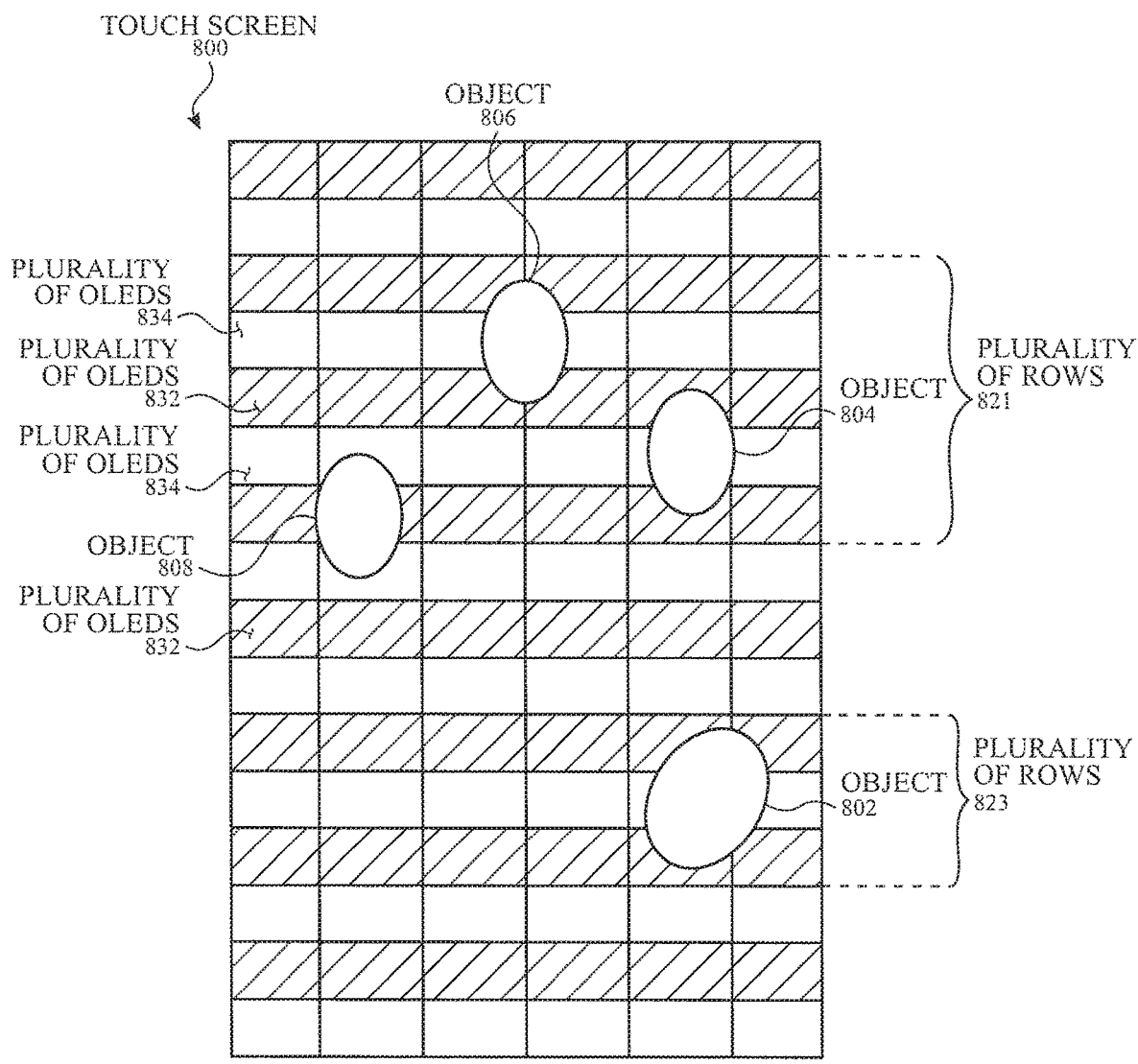
Figure 8C:
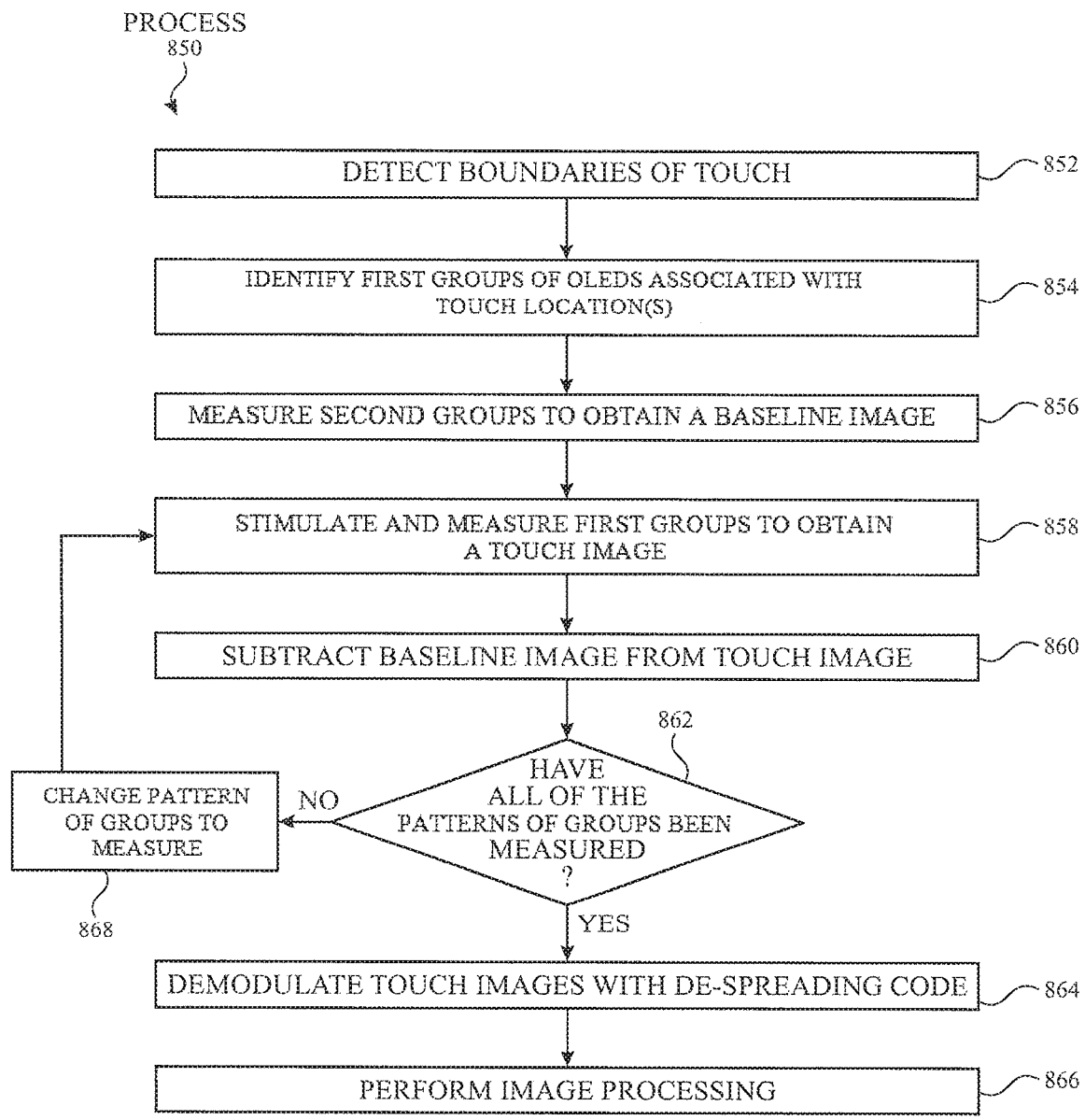
FIG. 8C illustrates an exemplary method for user identification according to examples of the disclosure.

FIGS. 8A-8B illustrate cross-sectional and top views of an exemplary touch screen, and FIG. 8C illustrates an exemplary method for user identification according to examples of the disclosure. Touch screen 800 can be configured for displaying one or more images during one time period and can be configured for touch sensing during another time period. For touch sensing, touch screen 800 can be configured for capacitive touch sensing and/or optical touch sensing (discussed above). By using capacitive and optical touch sensing, fine features can be resolved with higher resolution touch sensing. Furthermore, resolving fine features and higher resolution touch sensing can be expanded to large areas, such as the active area of the touch screen (e.g., active area of touch screen 124 illustrated in FIG. 1A).

Touch screen 800 can include diffuser 874, touch sensor 840, collimation 870, and OLED display 830. Collimation 870 can be disposed between the OLED display 830 and touch sensor 840 as to direct the OLED light emission toward one or more specific areas of top surface of the touch screen (e.g., towards an object (e.g., finger) located at the top surface of the touch screen). In some examples, the collimation function can be integrated into the OLED display 830 and/or touch sensor 840 by adjusting the structure and composition of the OLED material. In addition to the collimation 870, a diffuser 874 can be added to the top side (e.g., in the light path of OLED display 830 to the user) of the touch sensor 840. The diffuser 874 can serve multiple purposes, such as to diffuse the collimated light (e.g., in order to improve the viewing angle of the displayed image) and to collimate the reflected light from the object to be imaged toward the OLEDs included in touch sensor 840. Accordingly, a high resolution optical touch image can be obtained.

Touch screen 800 can include plurality of OLEDs 832 and plurality of OLEDs 834 grouped in rows (e.g., plurality of rows 821 and plurality of rows 823). Although FIG. 8B illustrates the OLEDs as being grouped in rows, in some examples, other group shapes are possible (e.g., checkerboard-shaped group patterns illustrated in FIG. 3K). Object 802, object 804, object 806, and object 808 can be in contact with touch screen 800. In some examples, object 802, object 804, object 806, and object 808 can be a user's fingers. For example, object 802 can be a thumb; object 804 can be an index finger; object 806 can be a middle finger; and object 808 can be a ring finger.

The user identification process can begin by having the user place fingers (e.g., thumb, index finger, middle finger, and ring finger) in close proximity to or touching a surface of touch screen 800. Touch screen 800 can detect the location(s) of the touch (step 852 of process 850). In some examples, detecting the location(s) of the touch can include measuring a mutual or self capacitance. A controller can identify a plurality of first groups (e.g., rows as illustrated in FIGS. 3K and 8B or in a checkerboard pattern as illustrated in FIG. 3L) of OLEDs associated with touch boundaries (step 854 of process 850). In some examples, groups of OLEDs associated with touch boundaries can be groups of OLEDs for which at least one OLED in the group overlaps with a location on the touch screen 800 for which a touch of a predetermined threshold is detected. In some examples, the boundaries can be extended by a predetermined amount beyond the detected boundaries of a proximate or touching object. For example, the controller can identify the first groups as plurality of rows 821 and plurality of rows 823. Similarly, in some examples, the controller can identify groups of OLEDs in other shapes, such as the checkerboard-shaped groups illustrated in FIG. 3L.

A plurality of second groups (e.g., rows) of OLEDs can be measured to obtain a baseline (i.e., calibration) image (step 856 of process 850). The baseline group image can be indicative of noise from the OLED sensors, AFEs, and/or any external noise induced by ambient light, for example. In some examples, the OLEDs included in the plurality of second groups can be decoupled from current sources and/or deactivated when the baseline image is obtained. In some examples, the plurality of second groups (e.g., the second groups of OLEDs that were measured to obtain a baseline) can include the plurality of first groups (e.g., the first groups of OLEDs corresponding to the touch location(s)). In some examples, the plurality of second groups can be offset from the plurality of first groups of OLEDs. In some examples, the baseline image can be obtained prior to having the user touch (or hover over) the surface of touch screen 800. In some examples, multiple (e.g., two) group scans can be performed. A baseline scan can acquire a baseline group image with the associated OLED emitters disabled, and a touch scan can acquire touch data by performing a scan while the associated OLED emitters can be active with intensity levels set according to the spreading code in matrix 600, for example, as will be described.

The plurality of first rows of OLEDs can be stimulated and measured to obtain a touch image (step 858 of process 850). For a given approximate touch location, a processor can identify a first row and last display row associated with the boundaries of the associated touch. In some examples, the touch image acquisition can include scanning rows from the first row to the last row in sequence, as controlled by a processor. Each row scan can involve a row of OLEDs to be configured as OLED emitters and a row of OLEDs to be configured as OLED sensors. In some examples, all other rows (e.g., rows excluding plurality of rows 821 and plurality of rows 823) of OLEDs may be decoupled or deactivated. In some examples, the stimulation and measurement can be performed using optical touch sensing. In some examples, touch screen 800 can be configured for high resolution touch sensing. Obtaining the touch image (step 858 of process 800) using the plurality of first rows can include configuring a plurality of first OLEDs to emit light towards the object (e.g., steps 758-760 of process 750 illustrated in FIG. 7C) and configuring a plurality of second OLEDs to detect a reflection of the emitted light (e.g., steps 764-766 of process 750 illustrated in FIG. 7B).

The baseline image obtained in step 858 can be subtracted from the touch image obtained in step 860. The touch row image, besides internal and external noise, can also include a reading of reflected light (e.g., light reflected from a proximate object, such as a finger). By subtracting baseline from uncompensated touch image, internal/external noise can be largely subtracted from the uncompensated touch image, therefore improving the fidelity and thus dynamic range of the touch image, for example. In some examples, this process can be similar to correlated double sampling. Different patterns of rows can be measured (step 868 of process 850) until all patterns of rows have been measured (step 862 of process 850). Once all row scans are completed, baseline row image can be subtracted from the touch row image to obtain a full touch image for the first frame. The whole procedure can be repeated for following N−1 touch frames, but for each subsequent touch frame, the intensity levels for the N OLEDs can be varied according to matrix 600. After all touch frames are acquired, the N touch frames can be demodulated with the inverse of matrix 600 (e.g., a de-spreading code) to acquire the final touch image for further processing by processor (step 864 of process 850). A controller can perform image processing (step 868 of process 850), and the image can be matched to one or more stored images for user identification. If the image is matched to the one or more stored images, then the touch screen can perform an action (e.g., unlock the touch screen). Although some examples involve OLEDs grouped by row, in some examples, the groups can have different shapes, such as a checkerboard arrangement.

Figure 9:
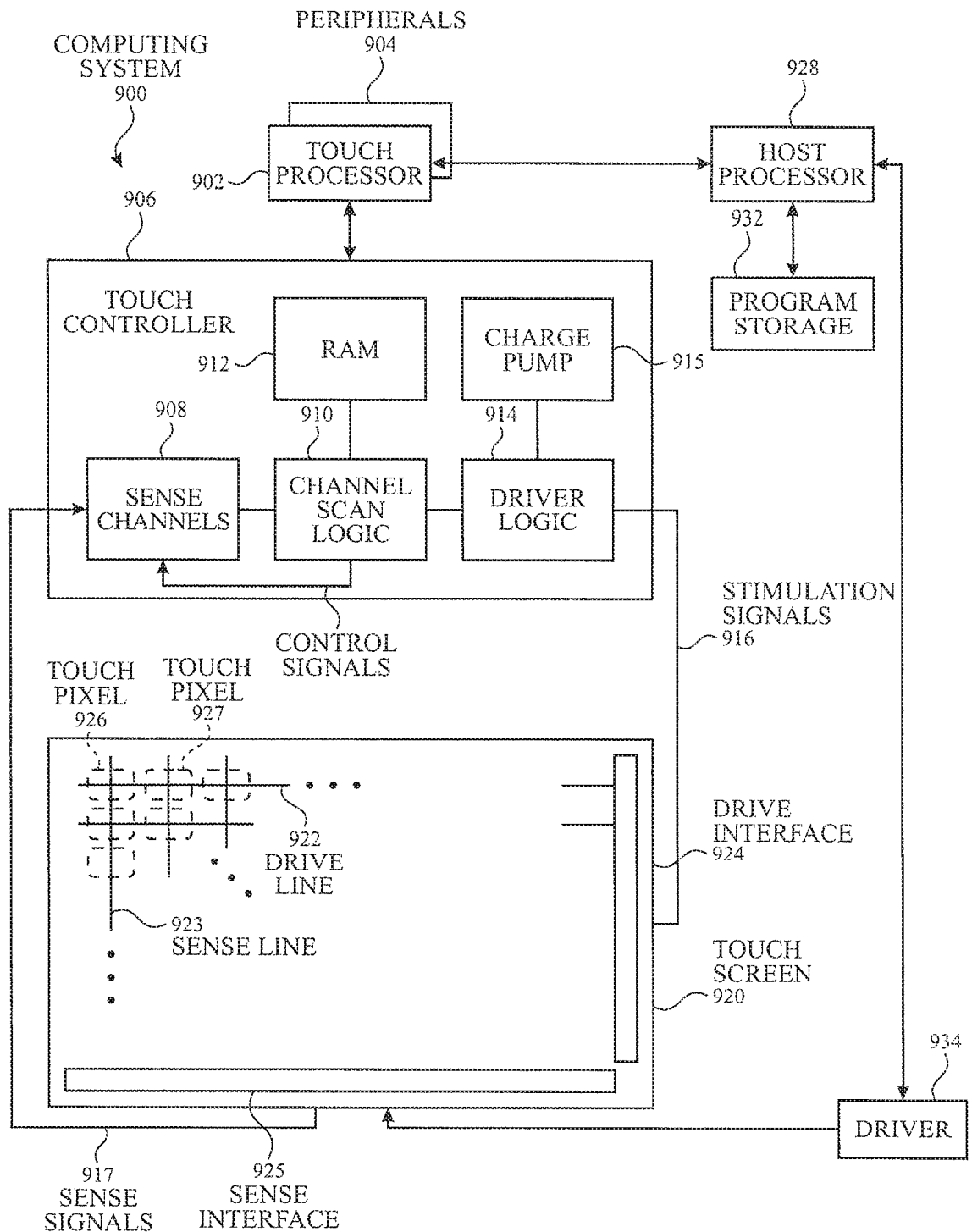
FIG. 9 illustrates a block diagram of an exemplary computing system that including a touch screen according to examples of the disclosure.

FIG. 9 illustrates a block diagram of an exemplary computing system that illustrates one implementation of an example touch screen according to examples of the disclosure. Computing system 900 could be included in, for example, mobile telephone 936, digital media player 940, personal computer 944, or any mobile or non-mobile computing device that includes a touch screen. Computing system 900 can include a touch sensing system including one or more touch processors 902, peripherals 904, a touch controller 906, and touch sense circuitry (described in more detail below). Peripherals 904 can include, but are not limited to, random access memory (RAM) or other types of memory or storage, watchdog timers and the like. Touch controller 906 can include, but is not limited to, one or more sense channels 908, channel scan logic 910 and driver logic 914. Channel scan logic 910 can access RAM 912, autonomously read data from the sense channels and provide control for the sense channels. In addition, channel scan logic 910 can control driver logic 914 to generate stimulation signals 916 at various frequencies and/or modes that can be selectively applied to drive regions of the touch sense circuitry of touch screen 920, as described in more detail below. In some examples, touch controller 906, touch processor 902 and peripherals 904 can be integrated into a single application specific integrated circuit (ASIC).

Computing system 900 can also include a host processor 928 for receiving outputs from touch processor 902 and performing actions based on the outputs. For example, host processor 928 can be connected to program storage 932 and a display controller, such as a driver 934. Host processor 928 can use driver 934 to generate an image on touch screen 920, such as an image of a user interface (UI), and can use touch processor 902 and touch controller 906 to detect a touch on or near touch screen 920, such as a touch input to the displayed UI. In some examples, host processor 928 can use driver 934 to perform optical touch sensing. The touch input can be used by computer programs stored in program storage 932 to perform actions that can include, but are not limited to, moving an object such as a cursor or pointer, scrolling or panning, adjusting control settings, opening a file or a document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 928 can also perform additional functions that may not be related to touch processing.

Touch screen 920 can include touch sense circuitry that can include a capacitive sensing medium having a plurality of drive lines 922 and a plurality of sense lines 923. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 922 can be driven by stimulation signals 916 from driver logic 914 through a drive interface 924, and resulting sense signals 917 generated in sense lines 923 can be transmitted through a sense interface 925 to sense channels 908 (also referred to as an event detection and demodulation circuit) in touch controller 906. In this way, drive lines and sense lines can be part of the touch sense circuitry that can interact to form capacitive sensing nodes, which can be thought of as touch picture elements (touch pixels), such as touch pixels 926 and 927. This way of understanding can be particularly useful when touch screen 920 is viewed as capturing an "image" of touch. In other words, after touch controller 906 has determined whether a touch has been detected at each touch pixel in the touch screen, the pattern of touch pixels in the touch screen at which a touch occurred can be thought of as an "image" of touch (e.g., a pattern of fingers touching the touch screen). In some examples, optical touch sensing can be used in addition to or as an alternative to capacitive (e.g., self and/or mutual capacitance) touch sensing.

Therefore, according to the above, some examples of the disclosure are directed to a touch screen, comprising: a plurality of light emitting diodes (LEDs) configured to emit a first light for displaying one or more images, the plurality of LEDs including first LEDs and second LEDs, the first LEDs configured to emit a second light for optical touch sensing, and the second LEDs configured to sense at least a portion of a reflection of the second light and generate one or more signals indicative of the reflection of the second light; a plurality of current sources coupled to the plurality of LEDs; sense circuitry coupled to the second LEDs; a switch configured to electrically couple and decouple the plurality of current sources to the sense circuitry during a touch sensing mode; and a processor configured to: receive the one or more signals generated by the second LEDs, and determine one or more properties of one or more proximate objects based on the one or more signals. Additionally or alternatively, in some examples, the plurality of current sources are configured to apply a forward bias across the first LEDs and further configured to apply a reverse bias across the second OLEDs during the touch sensing mode. Additionally or alternatively, in some examples, the first LEDs are further configured to sense at least a portion of the reflection of the second light, and the second LEDs are further configured to emit the second light. Additionally or alternatively, in some examples, the touch screen further comprises an analog to digital converter (ADC) having an input and an output, the input coupled to the one or more signals, and the output coupled to the processor. Additionally or alternatively, in some examples, the sense circuitry further comprises: a function generator configured to produce a ramp function, a plurality of comparators configured to compare the ramp function to the one or more signals and further configured to generate an enable signal when the ramp function matches the one or more signals, each comparator coupled to one of the second LEDs; and a plurality of registers configured to store the ramp function, each register coupled to one of the plurality of comparators. Additionally or alternatively, in some examples, the first LEDs are arranged in first rows, the second LEDs are arranged in second rows, and the first rows are interleaved with the second rows. Additionally or alternatively, in some examples, at least two of the first rows are adjacent. Additionally or alternatively, in some examples, the touch screen excludes capacitive touch sensors. Additionally or alternatively, in some examples, the sense circuitry includes a sense amplifier operatively coupled to a compensation signal, the compensation signal configured to compensate for a leakage current received by the sense amplifier.

According to the above, some examples of the disclosure are directed to a method of operating a touch screen, the method comprising: applying first currents to a plurality of LEDs included in the touch screen, the first currents indicative of intensities, associated with one or more displayed images, of a first light; applying second currents to first LEDs, the first LEDs included in the plurality of LEDs, wherein the second currents cause the first LEDs to emit a second light; applying third currents to second LEDs to detect a reflection of at least a portion of the second light, wherein the second LEDs are included in the plurality of LEDs; generating, with the second LEDs, one or more signals in response to the detected reflected light; and determining, based on the received one or more signals, one or more properties of one or more proximate objects. Additionally or alternatively, in some examples, the second currents apply forward biases to the first LEDs, and the third currents apply reverse biases to the second LEDs. Additionally or alternatively, in some examples, applying the third currents to the second LEDs occurs a non-zero time delay after applying the second voltages to the first LEDs. Additionally or alternatively, in some examples, applying the third currents to the second LEDs is concurrent with applying the second voltages to the first LEDs. Additionally or alternatively, in some examples, the method further comprises: modulating the second voltages with a plurality of waveforms included in an encoding matrix, wherein waveforms associated with adjacent first LEDs are separate and distinct; and demodulating the one or more signals with an inverse of the encoding matrix. Additionally or alternatively, in some examples, the one or more properties includes optical properties, the method further comprising: determining, based on the optical properties, whether at least one of the one or more proximate objects is water; and rejecting the one or more signals associated with the at least one of the one or more proximate objects that is water. Additionally or alternatively, in some examples, the LEDs are organic light emitting diodes (OLEDs).

According to the above, some examples of the disclosure are directed to a touch screen, comprising: a plurality of light emitting diodes (LEDs) configured to emit a first light for displaying one or more images, the plurality of LEDs including first LEDs and second LEDs, the first LEDs configured to emit a second light for optical touch sensing, and the second LEDs configured to sense at least a portion of a reflection of the second light and generate one or more signals first indicative of the reflection of the second light; a plurality of current sources coupled to the plurality of LEDs; a first sense circuitry coupled to the second LEDs; a switch configured to electrically couple and decouple the plurality of current sources to the first sense circuitry during a touch sensing mode; a plurality of first touch electrodes configured to receive a first voltage; a plurality of second touch electrodes configured to capacitively couple to the plurality of first touch electrodes; a second sense circuitry coupled to the plurality of second touch electrodes, the sense circuitry configured to sense a change in capacitance and generate one or more second signals indicative of the change in capacitance; and a processor configured to: receive the one or more first signals generated by the second OLEDs, receive the one or more second signals generated by the plurality of second touch electrodes, and determine one or properties of one or more proximate objects based one or more of the one or more first signals and the one or more second signals. Additionally or alternatively, in some examples, the plurality of first and second touch electrodes are configured to capacitively sense the one or more proximate objects during a first time, and the plurality of LEDs are configured to optically sense the one or more proximate objects during a second time, the second time following the first time. Additionally or alternatively, in some examples, the touch screen further comprises a spatial filter configured to focus the second light and resolve one or more features included in one or more objects. Additionally or alternatively, in some examples, the spatial filter includes a plurality of layers, each layer separated from another layer by at least a substrate. Additionally or alternatively, in some examples, the touch screen further comprises a collimation layer and a diffuser layer. Additionally or alternatively, in some examples, the collimation layer is disposed between the plurality of OLEDs and a touch electrode layer, the touch electrode layer including the first and second plurality of touch electrodes, and the diffuser layer is disposed on top of the touch electrode layer, the collimation layer, and the plurality of OLEDs. Additionally or alternatively, in some examples, the LEDs are organic light emitting diodes (OLEDs).

According to the above, some examples of the disclosure are directed to a method of operating a touch screen, the method comprising: stimulating a plurality of first touch electrodes with a first voltage; sensing a change in capacitance at a plurality of second touch electrodes, the plurality of second touch electrodes capacitively coupled to the plurality of first touch electrodes; generating, with the plurality of second touch electrodes, one or more first signals in response to the change in capacitance; applying first currents to a plurality of light emitting diodes (LEDs) included in the touch screen, the first currents indicative of intensities, associated with one or more displayed images, of a first light; applying second currents to first LEDs, the first LEDs included in the plurality of LEDs, wherein the second currents cause the first LEDs to emit a second light; applying third currents to second LEDs to detect a reflection of at least a portion of the second light, wherein the second LEDs are included in the plurality of LEDs; generating, with the second LEDs, one or more second signals in response to the reflected light; and determining, based on one or more of the one or more first signals and the one or more second signals, one or more properties of one or more proximate objects. Additionally or alternatively, in some examples, the one or more properties of the one or more proximate objects include one or more locations associated with the one or more first signals. Additionally or alternatively, in some examples, the one or more locations are associated with a plurality of rows, and further wherein the first OLEDs and second OLEDs are located in the plurality of rows, the method further comprising: deactivating OLEDs located in rows, excluding the plurality of rows, of the touch screen. Additionally or alternatively, in some examples, the one or more properties of the one or more proximate objects includes one or more features included in the one or more proximate objects, the method further comprising: resolving the one or more features based on the one or more second signals. Additionally or alternatively, in some examples, the method further comprises identifying, based on the one or more second signals, one or more fingerprints; determining whether the one or more fingerprints match a stored one or more fingerprints; and unlocking the touch screen when the one or more fingerprints match the stored one or more fingerprints.

Although examples have been fully described with reference to the accompanying drawings, it is to be noted that various changes and modifications will become apparent to those skilled in the art. Such changes and modifications are to be understood as being included within the scope of the various examples as defined by the appended claims.

What is claimed:

1. A touch screen, comprising:
   a plurality of light emitting diodes (LEDs) configured to emit a first light for displaying one or more images, the plurality of LEDs including first LEDs and second LEDs, the first LEDs configured to emit a second light for optical touch sensing, the second light being a predetermined light different from and independent from the one or more images displayed with the first light, and the second LEDs configured to sense at least a portion of a reflection of the second light and generate one or more signals indicative of the reflection of the second light;
   a plurality of current sources coupled to the plurality of LEDs;
   sense circuitry coupled to the second LEDs;
   a switch configured to electrically couple and decouple the second LEDs to the sense circuitry during a touch sensing mode; and
   a processor configured to:
      receive the one or more signals generated by the second LEDs, and
      determine one or more properties of one or more proximate objects based on the one or more signals.

2. The touch screen of claim 1, wherein the plurality of current sources are configured to apply a forward bias across the first LEDs and further configured to apply a reverse bias across the second OLEDs during the touch sensing mode.

3. The touch screen of claim 1, wherein the first LEDs are further configured to sense at least a portion of the reflection of the second light, and the second LEDs are further configured to emit the second light.

4. The touch screen of claim 1, further comprising an analog to digital converter (ADC) having an input and an output, the input coupled to the one or more signals, and the output coupled to the processor.

5. The touch screen of claim 1, wherein the sense circuitry further comprises:
   a function generator configured to produce a ramp function,
   a plurality of comparators configured to compare the ramp function to the one or more signals and further configured to generate an enable signal when the ramp function matches the one or more signals, each comparator coupled to one of the second LEDs; and a plurality of registers configured to store the ramp function, each register coupled to one of the plurality of comparators.

6. The touch screen of claim 1, wherein the first LEDs are arranged in first rows, the second LEDs are arranged in second rows, and the first rows are interleaved with the second rows.

7. The touch screen of claim 6, wherein at least two of the first rows are adjacent.

8. The touch screen of claim 1, wherein the touch screen excludes capacitive touch sensors.

9. The touch screen of claim 1, wherein the sense circuitry includes a sense amplifier operatively coupled to a compensation signal, the compensation signal configured to compensate for a leakage current received by the sense amplifier.

10. The touch screen of claim 1, further comprising:
a plurality of touch electrodes configured to sense a capacitance;
a second sense circuitry coupled to the plurality of touch electrodes, the second sense circuitry configured to generate one or more second signals indicative of the change in capacitance, wherein the processor is further configured to:
receive the one or more second signals generated by the plurality of touch electrodes; and
determine one or more properties of the one or more proximate objects based on the one or more second signals.

11. The touch screen of claim 10, wherein:
the plurality of touch electrodes comprise a first plurality of touch electrodes configured to receive a first voltage, and a second plurality of touch electrodes configured to capacitively couple to the first plurality of touch electrodes, and
the second sense circuitry is coupled to the second plurality of touch electrodes.

12. The touch screen of claim 10, wherein the processor is further configured to:
determine one or more locations of one or more proximate objects using the second sense circuitry; and
select, from the plurality of LEDs, the first LEDs and the second LEDs that are located at the one or more locations of the one or more proximate objects.

13. A method of operating a touch screen, the method comprising:
applying first currents to a plurality of LEDs included in the touch screen, the first currents indicative of intensities, associated with one or more displayed images, of a first light;
applying second currents to first LEDs, the first LEDs included in the plurality of LEDs, wherein the second currents cause the first LEDs to emit a second light, the second light being a predetermined light different from and independent from the one or more images displayed with the first light;
applying third currents to second LEDs to detect a reflection of at least a portion of the second light, wherein the second LEDs are included in the plurality of LEDs;
generating, with the second LEDs, one or more signals in response to the detected reflected light; and
determining, based on the received one or more signals, one or more properties of one or more proximate objects.

14. The method of claim 13, wherein the second currents apply forward biases to the first LEDs, and the third currents apply reverse biases to the second LEDs.

15. The method of claim 13, wherein applying the third currents to the second LEDs occurs a non-zero time delay after applying the second currents to the first LEDs.

16. The method of claim 13, wherein applying the third currents to the second LEDs is concurrent with applying the second currents to the first LEDs.

17. The method of claim 13, further comprising:
modulating the second currents with a plurality of waveforms included in an encoding matrix, wherein waveforms associated with adjacent first LEDs are separate and distinct; and
demodulating the one or more signals with an inverse of the encoding matrix.

18. The method of claim 13, wherein the one or more properties includes optical properties, the method further comprising:
in accordance with a determination that the optical properties of the one or more proximate objects are indicative of one or more objects that are not water, processing one or more locations of the one or more proximate objects as touch locations; and
in accordance with a determination that the optical properties of the one or more proximate objects are indicative of water on the touch screen, forgoing processing the one or more locations as touch locations.

19. The method of claim 13, wherein the LEDs are organic light emitting diodes (OLEDs).

20. The method of claim 13, further comprising:
sensing, with a plurality of touch electrodes, a capacitance;
generating, with the plurality of touch electrodes, one or more second signals indicative of the change in capacitance; and
determining, based on the received one or more second signals, one or more properties of the one or more proximate objects.

21. The method of claim 20, wherein sensing the capacitance comprises:
receiving, with a first plurality of the plurality of touch electrodes, a first voltage; and
capacitively coupling, with a second of the plurality of touch electrodes, to the plurality of first plurality of touch electrodes, wherein the second sense circuitry is coupled to the second plurality of touch electrodes.

22. The method of claim 13, further comprising:
producing, with a function generator, a ramp function;
comparing, with a plurality of comparators, the ramp function to the one or more signals generated with the second LEDs;
generating, with the plurality of comparators, one or more enable signals when the ramp function matches the one or more signals generated with the second LEDs; and
in response to detecting the one or more enable signals, storing, with a plurality of registers, the ramp function.

* * * * *